(12) United States Patent  (10) Patent No.: US 7,786,429 B2
Glenn et al.  (45) Date of Patent: Aug. 31, 2010

(54) CAMERA MODULE WITH WINDOW MECHANICAL ATTACHMENT

(75) Inventors: Thomas P. Glenn, Gilbert, AZ (US); Steven Webster, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 12/221,948

(22) Filed: Aug. 8, 2008

(65) Prior Publication Data

US 2008/0308717 A1  Dec. 18, 2008

Related U.S. Application Data

(63) Continuation of application No. 11/206,513, filed on Aug. 17, 2005, now Pat. No. 7,425,750, which is a continuation of application No. 10/286,269, filed on Oct. 31, 2002, now Pat. No. 6,946,316, which is a continuation of application No. 09/457,516, filed on Dec. 8, 1999, now Pat. No. 6,483,030.

(51) Int. Cl.
*H01J 5/02* (2006.01)

(52) U.S. Cl. .................. 250/239; 250/216; 438/64; 257/434

(58) Field of Classification Search ........... 250/239; 257/433, 434, 81, 84; 438/64, 48, 69, 54
See application file for complete search history.

(56) References Cited

U.S. PATENT DOCUMENTS

| | | | |
|---|---|---|---|
| 3,018,689 A | 1/1962 | Saxe | 350/471 |
| 3,880,528 A | 4/1975 | Petersen et al. | 356/225 |
| 4,055,761 A | 10/1977 | Shimomura | 250/239 |
| 4,210,922 A | 7/1980 | Shannon | 357/24 |
| 4,293,190 A | 10/1981 | Clover | 350/241 |
| 4,390,220 A | 6/1983 | Benasutti | 339/17 |
| 4,433,886 A | 2/1984 | Cassarly et al. | 339/14 |
| 4,491,865 A | 1/1985 | Danna et al. | 358/98 |
| 4,582,350 A | 4/1986 | Okajima | 285/390 |

(Continued)

FOREIGN PATENT DOCUMENTS

GB  1022329  3/1966

(Continued)

OTHER PUBLICATIONS

Glenn et al., U.S. Appl. No. 11/206,513, filed Aug. 17, 2005, entitled "Snap Lid Camera Module".

(Continued)

*Primary Examiner*—Georgia Y Epps
*Assistant Examiner*—Tony Ko
(74) *Attorney, Agent, or Firm*—Gunnison, McKay & Hodgson, L.L.P.; Serge J. Hodgson

(57) ABSTRACT

An image sensor package includes a molding having a locking feature. The package further includes a snap lid having a tab, where the tab is attached to the locking feature of the molding. To form the image sensor package, a window is placed in a pocket of the molding. The snap lid is secured in place. Once secured, the snap lid presses against a peripheral region of an exterior surface of the window. The window is sandwiched between the molding and the snap lid and held in place.

20 Claims, 11 Drawing Sheets

U.S. PATENT DOCUMENTS

| | | | |
|---|---|---|---|
| 4,744,009 A | 5/1988 | Grabbe et al. | 361/398 |
| 4,801,998 A | 1/1989 | Okuaki | 357/72 |
| 4,843,313 A | 6/1989 | Walton | 324/158 |
| 4,896,217 A | 1/1990 | Miyazawa et al. | 358/213.11 |
| 4,936,784 A | 6/1990 | Saito | 439/72 |
| 4,971,930 A | 11/1990 | Fusaroli et al. | 437/217 |
| 4,980,635 A | 12/1990 | Walton et al. | 324/158 |
| 4,999,142 A | 3/1991 | Fukushima et al. | 264/1.7 |
| 5,001,315 A | 3/1991 | Runyan et al. | 200/307 |
| 5,023,442 A | 6/1991 | Taniguchi et al. | 250/208.1 |
| 5,037,187 A | 8/1991 | Oda et al. | 359/699 |
| 5,068,713 A | 11/1991 | Toda | 357/72 |
| 5,122,861 A | 6/1992 | Tamura et al. | 357/74 |
| 5,191,481 A | 3/1993 | Takizawa et al. | 359/811 |
| 5,220,198 A | 6/1993 | Tsuji | 257/731 |
| 5,274,456 A | 12/1993 | Izumi et al. | 358/209 |
| 5,365,101 A | 11/1994 | Tonai | 257/434 |
| 5,383,034 A | 1/1995 | Imamura et al. | 358/474 |
| 5,400,072 A * | 3/1995 | Izumi et al. | 348/335 |
| 5,412,229 A | 5/1995 | Kuhara et al. | 257/183 |
| 5,424,531 A | 6/1995 | O'Regan et al. | 250/216 |
| 5,434,682 A | 7/1995 | Imamura et al. | 358/474 |
| 5,436,492 A | 7/1995 | Yamanaka | 257/433 |
| 5,444,520 A | 8/1995 | Murano | 355/229 |
| 5,463,229 A | 10/1995 | Takase et al. | 257/59 |
| 5,489,995 A | 2/1996 | Iso et al. | 358/483 |
| 5,523,608 A | 6/1996 | Kitaoka et al. | 257/433 |
| 5,570,204 A | 10/1996 | Kumashiro | 358/471 |
| 5,579,164 A | 11/1996 | Chapnik | 359/618 |
| 5,581,094 A | 12/1996 | Hara et al. | 257/80 |
| 5,590,787 A | 1/1997 | Hodges | 206/724 |
| 5,604,362 A | 2/1997 | Jedlicka et al. | 257/233 |
| 5,615,052 A | 3/1997 | Doggett | 359/811 |
| 5,617,131 A | 4/1997 | Murano et al. | 347/223 |
| 5,655,189 A | 8/1997 | Murano | 399/220 |
| 5,672,902 A | 9/1997 | Hatanaka et al. | 257/431 |
| 5,692,083 A | 11/1997 | Bennett | 385/88 |
| 5,764,424 A | 6/1998 | Jaeger et al. | 359/702 |
| 5,783,815 A | 7/1998 | Ikeda | 250/208.1 |
| 5,801,374 A | 9/1998 | Campbell et al. | 250/208.2 |
| 5,804,827 A | 9/1998 | Akagawa et al. | 250/370.06 |
| 5,811,799 A | 9/1998 | Wu | 250/239 |
| 5,818,634 A | 10/1998 | Richard et al. | 359/565 |
| 5,821,532 A | 10/1998 | Beaman et al. | 250/239 |
| 5,825,033 A | 10/1998 | Barrett et al. | 250/370.1 |
| 5,825,560 A | 10/1998 | Ogura et al. | 359/822 |
| 5,825,954 A | 10/1998 | Dunn et al. | 385/79 |
| 5,838,703 A | 11/1998 | Lebby et al. | 372/43 |
| 5,861,654 A | 1/1999 | Johnson | 257/433 |
| 5,867,368 A | 2/1999 | Glenn | 361/783 |
| 5,902,993 A | 5/1999 | Okushiba et al. | 250/208.1 |
| 5,932,875 A | 8/1999 | Chung et al. | 250/239 |
| 5,949,655 A | 9/1999 | Glenn | 361/783 |
| 5,998,878 A | 12/1999 | Johnson | 257/797 |
| 6,011,294 A | 1/2000 | Wetzel | 257/434 |
| 6,011,661 A | 1/2000 | Weng | 359/819 |
| 6,020,582 A | 2/2000 | Bawolek et al. | 250/208.1 |
| 6,037,655 A | 3/2000 | Philbrick et al. | 257/680 |
| 6,060,722 A | 5/2000 | Havens et al. | 250/566 |
| 6,072,232 A | 6/2000 | Li et al. | 257/680 |
| 6,122,009 A | 9/2000 | Ueda | 348/335 |
| 6,130,448 A | 10/2000 | Bauer et al. | 257/222 |
| 6,134,057 A | 10/2000 | Ueyama et al. | 359/821 |
| 6,147,389 A | 11/2000 | Stern et al. | 257/434 |
| 6,153,927 A | 11/2000 | Raj et al. | 257/680 |
| 6,184,514 B1 | 2/2001 | Rezende et al. | 250/208.1 |
| 6,188,841 B1 | 2/2001 | Kamata | 396/6 |
| 6,236,046 B1 | 5/2001 | Watabe et al. | 250/338.1 |
| 6,243,540 B1 | 6/2001 | Kume et al. | 396/534 |
| 6,266,197 B1 | 7/2001 | Glenn et al. | 359/819 |
| 6,270,222 B1 | 8/2001 | Herpst | 359/511 |
| 6,384,397 B1 | 5/2002 | Takiar et al. | 250/208.1 |
| 6,384,472 B1 | 5/2002 | Huang | 257/680 |
| 6,389,687 B1 | 5/2002 | Glenn et al. | 29/832 |
| 6,392,703 B1 | 5/2002 | Uchino et al. | 348/373 |
| 6,392,827 B1 | 5/2002 | Ueyama et al. | 359/824 |
| 6,455,774 B1 | 9/2002 | Webster | 174/52.4 |
| 6,483,030 B1 | 11/2002 | Glenn et al. | 174/52.4 |
| 6,483,101 B1 | 11/2002 | Webster | 250/216 |
| 6,498,624 B1 | 12/2002 | Ogura et al. | 348/335 |
| 6,518,656 B1 | 2/2003 | Nakayama et al. | 257/680 |
| 6,526,653 B1 | 3/2003 | Glenn et al. | 29/830 |
| 6,627,864 B1 | 9/2003 | Glenn et al. | 250/208.1 |
| 6,627,872 B1 | 9/2003 | FuKamura et al. | 250/239 |
| 6,686,588 B1 | 2/2004 | Webster et al. | 250/239 |
| 6,762,796 B1 | 7/2004 | Nakajoh et al. | 348/340 |
| 6,767,753 B2 | 7/2004 | Huang | 438/25 |
| 6,791,076 B2 | 9/2004 | Webster | 250/239 |
| 6,867,438 B1 | 3/2005 | Maruyama et al. | 257/184 |
| 6,946,316 B2 | 9/2005 | Glenn et al. | 438/64 |
| 6,956,201 B2 | 10/2005 | Webster | 250/239 |
| 7,005,310 B2 | 2/2006 | Hanada et al. | 438/25 |
| 7,126,111 B2 | 10/2006 | Webster | 250/239 |
| 7,199,359 B2 | 4/2007 | Webster | 250/239 |
| 7,332,712 B2 | 2/2008 | Webster | 250/239 |
| 2003/0137595 A1 | 7/2003 | Takachi | 348/340 |

FOREIGN PATENT DOCUMENTS

| | | |
|---|---|---|
| GB | 2146504 | 4/1985 |
| JP | 59-228755 | 12/1984 |
| JP | 62-224047 | 10/1987 |
| JP | WO 93/22787 | 11/1993 |
| JP | 09-021938 | 1/1997 |
| JP | 09-232548 | 9/1997 |
| JP | 10-302587 | 11/1998 |
| WO | WO 00/38103 | 6/2000 |
| WO | WO 03/019660 | 3/2003 |

OTHER PUBLICATIONS

Webster et al., U.S. Appl. No. 12/005,081, filed Dec. 21, 2007, entitled "Method of Using a Camera Module".

* cited by examiner

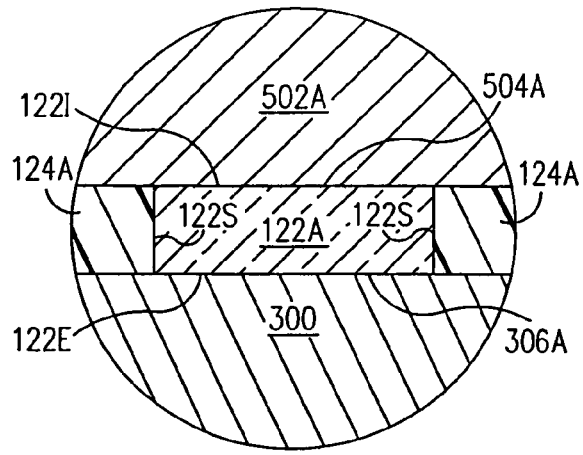
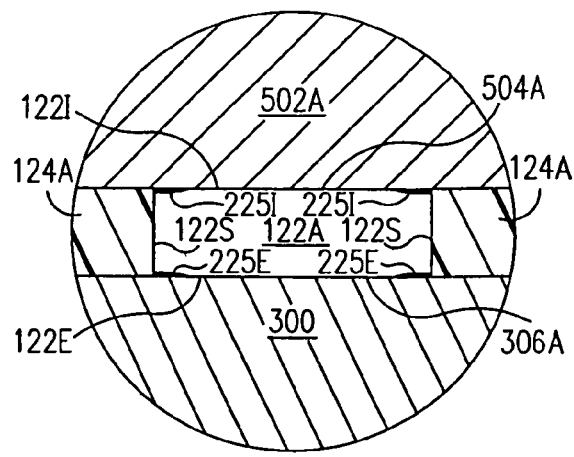
FIG. 7A    FIG. 7B
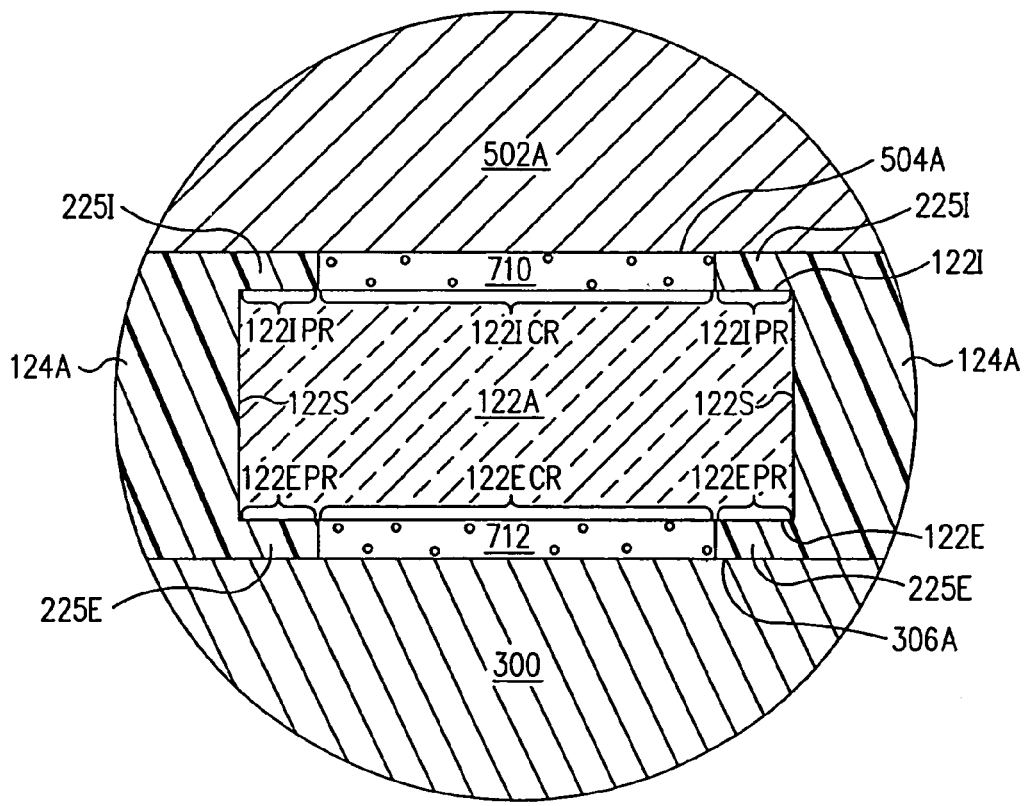
FIG. 7C

CAMERA MODULE WITH WINDOW MECHANICAL ATTACHMENT

CROSS REFERENCE TO RELATED APPLICATION

This application is a continuation of U.S. patent application Ser. No. 11/206,513, filed on Aug. 17, 2005, which is a continuation of U.S. patent application Ser. No. 10/286,269, filed on Oct. 31, 2002, now U.S. Pat. No. 6,946,316, issued Sep. 20, 2005, which is a continuation of U.S. patent application Ser. No. 09/457,516, filed on Dec. 8, 1999, now U.S. Pat. No. 6,483,030, issued Nov. 19, 2002.

FIELD OF THE INVENTION

The present invention relates generally to the packaging of electronic components. More particularly, the present invention relates to an image sensor package.

BACKGROUND OF THE INVENTION

Image sensors and assemblies are well known to those of skill in the art. In these assemblies, an image sensor was located within a housing which supported a window. Radiation passed through the window and struck the image sensor which responded to the radiation. For the image sensor to function properly, the image sensor had to be positionally aligned with the window to within tight positional tolerances.

Beaman et al., U.S. Pat. No. 5,821,532, hereinafter Beaman, which is herein incorporated by reference in its entirety, sets forth a printed circuit board which included a pair of apertures used as alignment features for mounting the image sensor and for mounting the optics which included the window. More particularly, the pair of apertures were used as the mounting reference for the image sensor and then were used as the mounting reference for the optics.

Formation of the assembly using the pair of apertures in the substrate as the alignment features resulted in at least three tolerance accumulations. First, a certain tolerance was associated with the formation, or patterning, of the metallic traces on the printed circuit board (see reference pads 14 and substrate 10 of Beaman FIG. 1). Second, a certain tolerance was associated with the placement of the image sensor on the substrate (see images sensor 32 and substrate 10 of Beaman FIG. 3). Third, a certain tolerance was associated the placement of the optics on the substrate (see Beaman FIG. 4).

After the image sensor assembly was constructed, the lens assembly was placed over the image sensor assembly. The lens assembly was used to focus light on the image sensor. Typically, the lens assembly was attached directly to the substrate after the image sensor assembly was attached to the substrate. After attachment, the lens assembly was adjusted, for example with adjustment screws, to move the lens assembly until the proper focus was attained. This very rough adjustment was labor intensive. Further, a large tolerance was associated with this very rough adjustment.

Disadvantageously, the image sensor assembly had to accommodate the tolerances discussed above. However, as the art moves to smaller, lighter and less expensive devices, the acceptable tolerances for image sensor assemblies diminishes.

In conventional image sensor assemblies, a housing was used to support the window and to hermetically seal the image sensor (see housing 24 and window 25 of Beaman FIG. 4 for example). This housing was typically formed of ceramic which advantageously had excellent resistance to moisture transmission to protect the image sensor from the ambient environment. Further, the ceramic housing was formed with a shelf which held the window and facilitated proper height positioning of the window (see shelf 29 and window 25 of Beaman FIG. 4 for example). However, ceramic is relatively expensive compared to other conventional packaging materials and it is important to form the image sensor assembly at a low cost.

In addition, mounting this housing at the printed circuit board level was inherently labor intensive and made repair or replacement of the image sensor difficult. In particular, removal of the housing exposed the image sensor to the ambient environment. Since the image sensor was sensitive to dust as well as other environmental factors, it was important to make repairs or replacement of the image sensor in a controlled environment such as a clean room. Otherwise, there was a risk of damaging or destroying the image sensor. Since neither of these alternatives are desirable and both are expensive, the art needs an image sensor assembly which is simple to manufacture and service so that costs associated with the image sensor assembly are minimized.

SUMMARY OF THE INVENTION

In accordance with the present invention, a plurality of image sensor packages are fabricated simultaneously to minimize the cost associated with each individual image sensor package. To fabricate the image sensor packages, a plurality of windows are placed in a mold. Molding compound is transferred to the mold to form a plurality of moldings, each of the moldings enclosing a corresponding window. The moldings are integrally connected together by bridge sections. After molding the windows in the molding compound, a molded window array, which includes the windows molded in corresponding moldings, is removed from the mold.

A substrate includes a plurality of individual substrates integrally connected together in an array format. Image sensors are attached to corresponding individual substrates. Bond pads of the image sensors are electrically connected to corresponding traces of the individual substrates.

The molded window array is aligned with the substrate such that each molding is precisely positioned with respect to the corresponding image sensor. After alignment, the molded window array is brought into abutting contact with an upper surface of the substrate such that an adhesive layer attaches the molded window array to the substrate. In one embodiment, the moldings are marked and a lower surface of the substrate is populated with interconnection balls. The substrate and attached molded window array are singulated into a plurality of individual image sensor packages.

By forming a plurality of image sensor packages simultaneously, several advantages are realized. One advantage is that it is less labor intensive to handle and process a plurality of image sensor packages simultaneously rather than to handle and process each image sensor package on an individual basis. Another advantage is that usage of materials is more efficient when a plurality of image sensor packages are fabricated simultaneously. By reducing labor and using less material, the cost associated with each image sensor package is minimized.

Of importance, the molding of the image sensor package is a low cost molded part. Advantageously, the molding is significantly less expensive than housings of the prior art which were typically ceramic. Accordingly, the image sensor package in accordance with the present invention is significantly less expensive to manufacture than image sensor assemblies of the prior art.

By forming the molding of the image sensor package as a molded part, a distance, sometimes called the Z height, between the window and the image sensor is precisely controlled to within tight tolerance.

Recall that in the prior art, the window was placed on a shelf of a housing after the housing was fabricated. Since a significant tolerance was associated with the window placement, the distance between the window and the image sensor had significant variations from assembly to assembly. However, to insure optimum operation of the image sensor, it is important that the distance between the window and the image sensor be precise. Since the tolerance in this distance is reduced in an image sensor package in accordance with the present invention, the performance of an image sensor package in accordance with the present invention is superior to that of the prior art.

In one embodiment, the molding of the image sensor package includes a plurality of alignment notches. These alignment notches are used to align a lens to the image sensor.

Use of the alignment notches facilitates alignment of the lens to the image sensor. As discussed above, the molding is precisely aligned to the image sensor. Advantageously, this allows the lens to be precisely aligned to the image sensor in a single operation by aligning the lens to the alignment notches. Accordingly, alignment of the lens to the image sensor in accordance with the present invention is relatively simple. This is in contrast to the prior art, which required a first alignment of the image sensor to the larger substrate and a second alignment of the optics to the larger substrate.

Enviro-hermetically sealing the image sensor in accordance with the present invention also reduces complexity and cost in the event the image sensor must be replaced compared to the prior art. As used herein, the term "enviro-hermetically sealed" means sealed sufficiently to prevent environmental degradation, e.g., from dust or moisture, of the image sensor package and, more particularly, of the image sensor.

Recall that in the prior art, the housing which hermetically sealed the image sensor was mounted directly to the larger substrate. Thus, removal of the housing necessarily exposed the image sensor to the ambient environment and to dust. For this reason, the image sensor had to repaired or replaced in a cleanroom or else there was a risk of damaging or destroying the image sensor.

In contrast, the image sensor is enviro-hermetically sealed as part of the image sensor package in accordance with the present invention. The image sensor package is mounted to the larger substrate, for example, by reflowing interconnection balls. To replace the image sensor, the image sensor package is simply removed and a new image sensor package is mounted to the larger substrate. At no time is the image sensor exposed to the ambient environment during this procedure. Advantageously, this procedure can be performed in any facility with or without a cleanroom. The old image sensor package is discarded or shipped to a central facility for repair. Since the image sensor package is simple to manufacture and service, the costs associated with the image sensor package are minimized compared to the prior art.

In one embodiment, an image sensor package includes a molding having an interior locking feature and an exterior locking feature. The molding is integral, i.e., is one piece and not a plurality of separate pieces connected together. The image sensor package further includes a window having an interior surface and an exterior surface. The exterior locking feature of the molding contacts a periphery of the exterior surface of the window and the interior locking feature of the molding contacts a periphery of the interior surface of the window.

By having the molding extend over the peripheries of the exterior and interior surfaces of the window, the distance which moisture must travel along the interface between the molding and the window to reach the image sensor is maximized thus essentially eliminating moisture ingress into the image sensor package.

In another embodiment, an image sensor package includes a window and a molding, where the molding includes a lens holder extension portion extending upwards, e.g., in a first direction perpendicular to the exterior surface of the window, from the window. The lens holder extension portion includes a female threaded aperture extending upwards from the window such that the window is exposed through the aperture.

A lens is supported in a lens support. The lens support has a threaded exterior surface. The lens support is threaded into the aperture of the lens holder extension portion.

Advantageously, the lens is readily adjusted relative to the image sensor by rotating the lens support. More particularly, the lens support is rotated around a longitudinal axis of the lens support in a first direction, e.g., clockwise looking down at the lens support, to move the lens support and the lens towards the image sensor. Conversely, the lens support is rotated around the longitudinal axis in a second direction opposite the first direction, e.g., counterclockwise looking down at the lens support, to move the lens support and the lens away from the image sensor. In this manner, the lens support is rotated until radiation passing through the lens is properly focused on an active area of the image sensor. Once proper focus is attained, the lens support is prevented from unintentional rotation. For example, adhesive is applied to secure the lens support to the molding.

Recall that in the prior art, the lens assembly was typically attached directly to the larger substrate, such as a printed circuit mother board, after the image sensor assembly was attached to the larger substrate. A large tolerance was associated with attachment of the lens assembly in this manner. However, it is important to reduce tolerance buildup to optimize performance of the image sensor assembly.

Further, the lens assembly of the prior art typically had to be adjusted by moving the lens assembly relative to the larger substrate, for example with adjustment screws. Undesirably, this was labor intensive which increased the cost of the electronic device which used the image sensor assembly.

In addition, the lens assembly of the prior art was sometimes inadvertently moved relative to the image sensor which caused defocusing and defective operation of the image sensor. For example, the lens assembly was sometimes bumped during assembly or servicing of the electronic device which used the image sensor assembly. As another example, the lens assembly moved due to warpage of the larger substrate.

Advantageously, the image sensor package in accordance with the present invention eliminates these problems of the prior art. In particular, since the molding including the lens holder extension portion is precisely positioned with respect to the image sensor, the position of the lens with respect to the image sensor is also precise to within tight tolerance. Reducing tolerance in the position of the lens with respect to the image sensor improves performance of the image sensor package compared to prior art image sensor assemblies.

Further, the lens is adjusted relative to the image sensor simply by rotating the lens support thus readily allowing focusing of radiation on the active area of the image sensor. Advantageously, this focusing is performed during fabrication of the image sensor package before assembly to the larger substrate. Thus, the prior art requirement of focusing the lens assembly during assembly of the larger substrate is eliminated. As a result, the costs associated with the image sensor package is lower than that associated with prior art image sensor assemblies.

Further, since the lens support and the lens are integrated into the image sensor package, there is essentially no possibility of inadvertently moving the lens relative to the image sensor. Thus the prior art possibility of bumping the lens assembly or otherwise having the lens assembly move and defocus the radiation is eliminated.

In another embodiment, an image sensor package includes a molding having a locking feature. The package further includes a snap lid having a tab, where the tab is attached to the locking feature of the molding.

To form the image sensor package, after the molding is fabricated, a window is placed in a pocket of the molding. A shelf of the molding contacts and supports a peripheral region of an interior surface of the window. The snap lid is secured in place. Once secured, the snap lid presses against a peripheral region of an exterior surface of the window.

Of importance, the window is sandwiched between the molding and the snap lid. In this manner, the window is held in place. Advantageously, use of the snap lid allows the window to be kept in a protective wrapper until the window is needed. For example, the window is kept in a protective wrapper to avoid contamination or scratching of the window.

As a further advantage, use of the snap lid allows the window to be easily removed. Once removed, the window is easily cleaned, treated or replaced with a different window.

Also in accordance with the invention, a molded window array includes a plurality of moldings integrally connected together and a plurality of windows. Each window of the plurality of windows is support in a corresponding molding of the plurality of moldings.

These and other features and advantages of the present invention will be more readily apparent from the detailed description set forth below taken in conjunction with the accompanying drawings.

BRIEF DESCRIPTION OF THE DRAWINGS

FIG. 7A is an enlarged cross-sectional view of the region VII of FIG. 6 in accordance with one embodiment of the present invention.

FIG. 7B is an enlarged cross-sectional view of the region VII of FIG. 6 in accordance with another embodiment of the present invention.

FIG. 7C is an enlarged cross-sectional view of the region VII of FIG. 6 in accordance with yet another embodiment of the present invention.

In the following description, similar elements are labeled with similar reference numbers.

DETAILED DESCRIPTION

Figure 5:
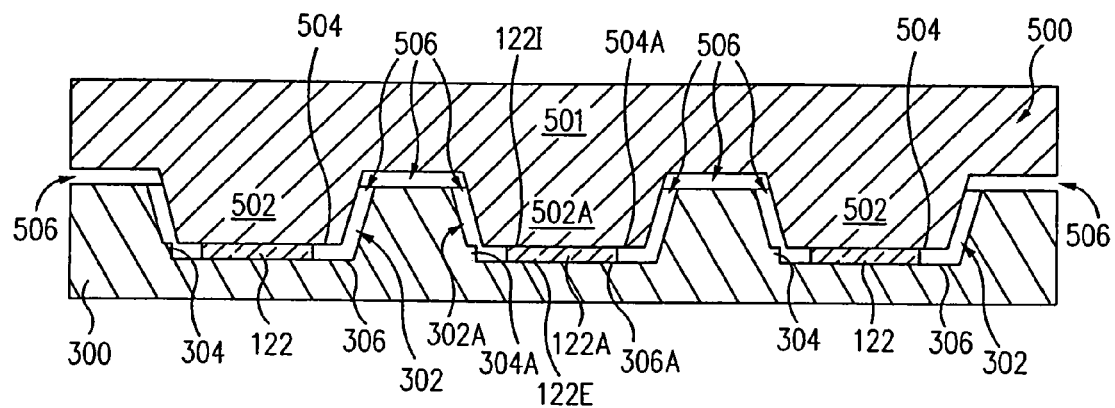
FIG. 5 is a cross-sectional view of the mold of FIGS. 3, 4 at a later stage of fabrication.

In accordance with the present invention, a plurality of image sensor packages 100 (FIGS. 1, 2) are fabricated simultaneously to minimize the cost associated with each individual package 100. To fabricate packages 100, a plurality of windows 122 are placed in a mold which includes upper and lower mold halves 300, 500 (FIG. 5). Molding compound is transferred to the mold to form a plurality of moldings 124 (FIG. 6), each of moldings 124 enclosing a corresponding window 122. Moldings 124 are integrally connected together by bridge sections 602. After molding windows 122 in the molding compound, a molded window array 802 (FIG. 8), which includes windows 122 molded in corresponding moldings 124, is removed from the mold.

A substrate 810 (FIG. 8) includes a plurality of individual substrates 102 integrally connected together in an array format. Image sensors 106 are attached to corresponding substrates 102. Bond pads 112 of image sensors 106 are electrically connected to corresponding traces 104 of corresponding substrates 102 with corresponding bond wires 114.

Figure 9:
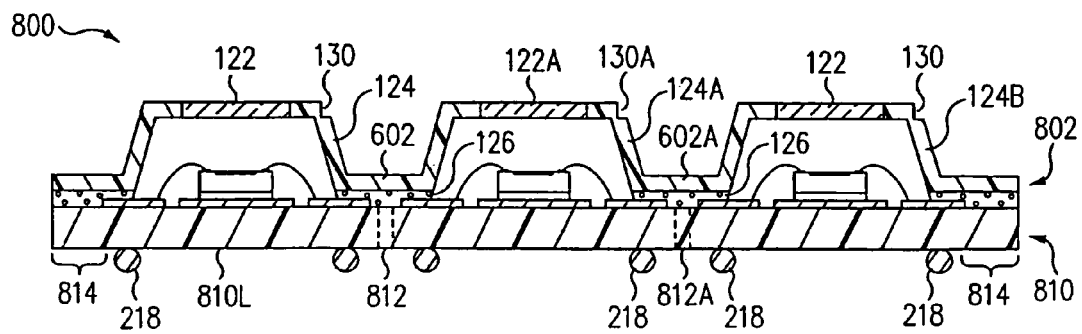
FIG. 9 is a cross-sectional view of the array of image sensor packages of FIG. 8 at a later stage of fabrication in accordance with the present invention.

Molded window array 802 is aligned with substrate 810 such that each molding 124 is precisely positioned with respect to a corresponding image sensor 106. After alignment, molded window array 802 is brought into abutting contact with an upper surface 810U of substrate 810 such that an adhesive layer 126 attaches molded window array 802 to substrate 810 as shown in FIG. 9. In one embodiment, moldings 124 are marked and a lower surface 810L of substrate 810 is populated with interconnection balls 218. Substrate 810 and attached molded window array 802 are singulated into a plurality of individual packages 100.

Figure 1:
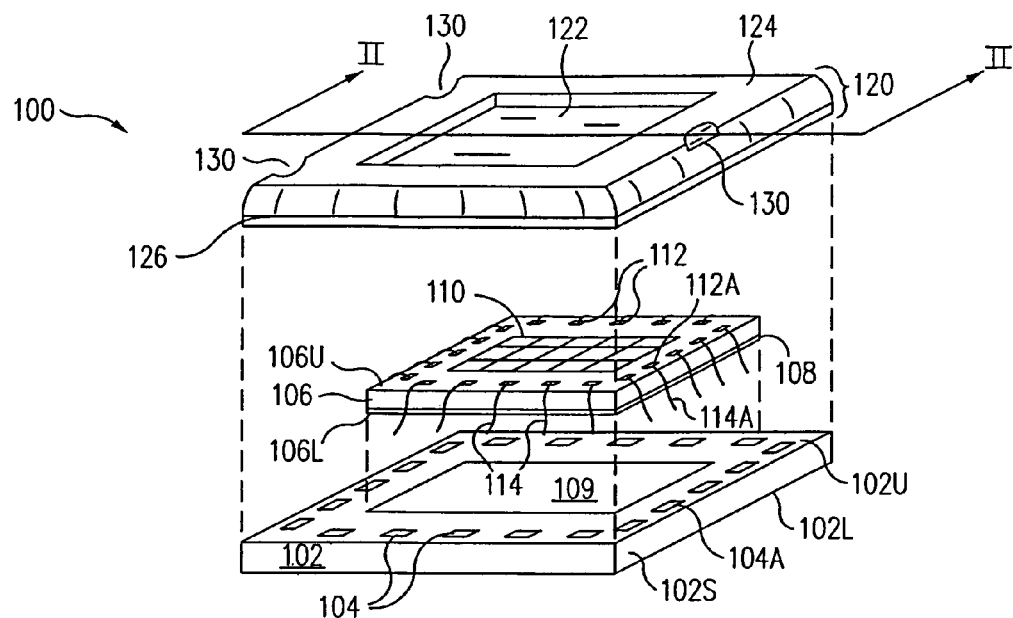
FIG. 1 is an exploded perspective view of an image sensor package in accordance with the present invention.
Figure 2:
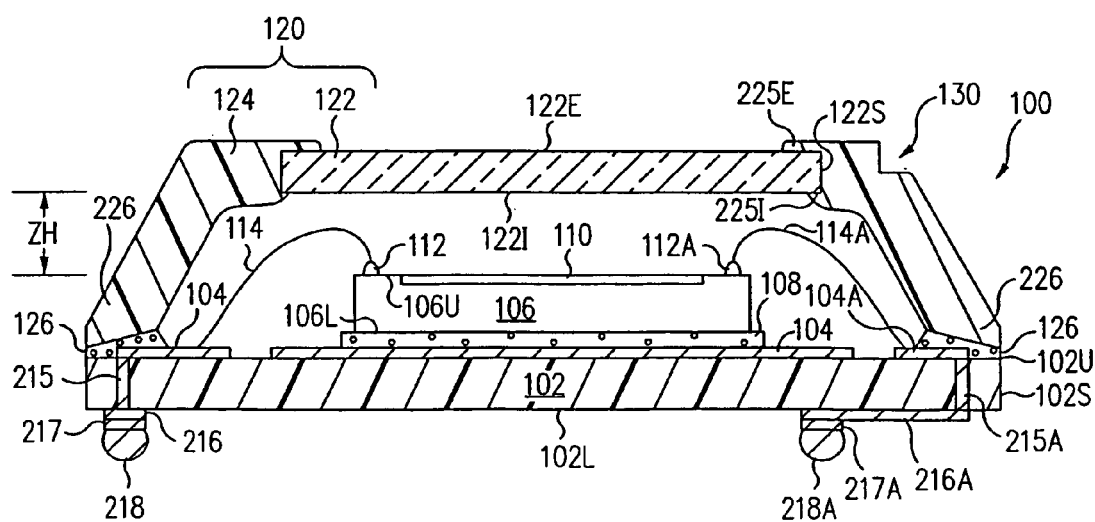
FIG. 2 is a cross-sectional view of the package taken along the line II-II of FIG. 1.

Referring to FIGS. 1 and 2 together, by forming a plurality of packages 100 simultaneously, several advantages are realized. One advantage is that it is less labor intensive to handle and process a plurality of packages 100 simultaneously rather than to handle and process each package 100 on an individual basis.

Another advantage is that usage of materials is more efficient when a plurality of packages 100 are fabricated simultaneously. By reducing labor and using less material, the cost associated with each package 100 is minimized.

Of importance, molding 124 is a low cost molded part. Advantageously, molding 124 is significantly less expensive than housings of the prior art which were typically ceramic. Accordingly, package 100 in accordance with the present invention is significantly less expensive to manufacture than image sensor assemblies of the prior art.

By forming molding 124 as a molded part, a distance ZH, sometimes called the Z height, between window 122 and image sensor 106 is precisely controlled to within tight tolerance.

Recall that in the prior art, the window was placed on a shelf of a housing after the housing was fabricated. Since a significant tolerance was associated with the window placement, the distance between the window and the image sensor had significant variations from assembly to assembly. However, to insure optimum operation of the image sensor, it is important that the distance between the window and the image sensor be precise. Since the tolerance in this distance is reduced in package 100, the performance of package 100 is superior to that of the prior art.

In one embodiment, molding 124 of package 100 includes a plurality of alignment notches 130. Alignment notches 130 are used to align a lens (not shown) to image sensor 106.

Use of alignment notches 130 facilitates alignment of the lens to image sensor 106. As discussed above, molding 124 is precisely aligned to image sensor 106. Advantageously, this allows the lens to be precisely aligned to image sensor 106 in a single operation by aligning the lens to alignment notches 130. Accordingly, alignment of the lens to image sensor 106 is relatively simple. This is in contrast to the prior art, which required a first alignment of the image sensor to the larger substrate and a second alignment of the optics to the larger substrate.

Enviro-hermetically sealing image sensor 106 in accordance with the present invention also reduces complexity and cost in the event image sensor 106 must be repaired or replaced compared to the prior art. Recall that in the prior art, the housing which hermetically sealed the image sensor was mounted directly to the larger substrate. Thus, removal of the housing necessarily exposed the image sensor to the ambient environment and to dust. For this reason, the image sensor had to be repaired or replaced in a cleanroom or else there was a risk of damaging or destroying the image sensor.

In contrast, image sensor 106 is enviro-hermetically sealed as part of package 100. Package 100 is mounted to the larger substrate, for example, by reflowing interconnection balls 218. To repair or replace image sensor 106, package 100 is simply removed and a new package 100 is mounted to the larger substrate. At no time is image sensor 106 exposed to the ambient environment during this procedure. Advantageously, this procedure can be performed in any facility with or without a cleanroom. The old package 100 is discarded or shipped to a central facility for repair. Since package 100 is simple to manufacture and service, the costs associated with package 100 are minimized compared to the prior art.

In one embodiment, molding 124 has an interior locking feature 225I and an exterior locking feature 225E. Molding 124 is integral, i.e., is one piece and not a plurality of separate pieces connected together. Window 122 has an interior surface 122I and an exterior surface 122E. Exterior locking feature 225E of molding 124 contacts a periphery of exterior surface 122E of window 122 and interior locking feature 225I of molding 124 contacts a periphery of interior surface 122I of window 122.

By having molding 124 extend over peripheries of exterior and interior surfaces 122E, 122I of window 122, the distance which moisture must travel along the interface between molding 124 and window 122 to reach image sensor 106 is maximized thus essentially eliminating moisture ingress into package 100.

In another embodiment, an image sensor package 1100 (FIGS. 11, 12) includes window 122 and a molding 124C, where molding 124C includes a lens holder extension portion 1102 extending upwards, e.g., in a first direction, from window 122. Lens holder extension portion 1102 includes a female threaded aperture 1106 extending upwards from window 122 such that window 122 is exposed through aperture 1106.

A lens 1210 is supported in a lens support 1112. Lens support 1112 has a threaded exterior surface 1120. Lens support 1112 is threaded into aperture 1106 of lens holder extension portion 1102.

Advantageously, lens 1210 is readily adjusted relative to image sensor 106 by rotating lens support 1112. More particularly, lens support 1112 is rotated around a longitudinal axis 1218 of lens support 1112 in a first direction, e.g., clockwise looking down at lens support 1112, to move lens support 1112 and lens 1210 towards image sensor 106. Conversely, lens support 1112 is rotated around longitudinal axis 1218 in a second direction opposite the first direction, e.g., counterclockwise looking down at lens support 1112, to move lens support 1112 and lens 1210 away from image sensor 106. In this manner, lens support 1112 is rotated until radiation passing through lens 1210 is properly focused on an active area 110 of image sensor 106. Once proper focus is attained, lens support 1112 is prevented from unintentional rotation. For example, adhesive is applied to secure lens support 1112 to molding 124C.

Recall that in the prior art, the lens assembly was typically attached directly to the larger substrate, such as a printed circuit mother board, after the image sensor assembly was attached to the larger substrate. A large tolerance was associated with attachment of the lens assembly in this manner. However, it is important to reduce tolerance to optimize performance of the image sensor assembly.

Further, the lens assembly of the prior art typically had to be adjusted by moving the lens assembly relative to the larger substrate, for example with adjustment screws. Undesirably, this was labor intensive which increased the cost of the electronic device which used the image sensor assembly.

In addition, the lens assembly of the prior art was sometimes inadvertently moved relative to the image sensor which caused defocusing and defective operation of the image sensor. For example, the lens assembly was sometimes bumped during assembly or servicing of the electronic device which used the image sensor assembly. As another example, the lens assembly moved due to warpage of the larger substrate.

Advantageously, package 1100 in accordance with the present invention eliminates these problems of the prior art. In particular, since molding 124C including lens holder extension portion 1102 is precisely positioned with respect to image sensor 106, the position of lens 1210 with respect to image sensor 106 is also precise to within tight tolerance. Reducing tolerance in the position of lens 1210 with respect to image sensor 106 improves performance of package 1100 compared to prior art image sensor assemblies.

Further, lens 1210 is adjusted relative to image sensor 106 simply by rotating lens support 1112 thus readily allowing focusing of radiation on active area 110 of image sensor 106. Advantageously, this focusing is performed during fabrication of package 1100 before assembly to the larger substrate. Thus, the prior art requirement of focusing the lens assembly during assembly of the larger substrate is eliminated. As a result, the costs associated with package 1100 are lower than those associated with prior art image sensor assemblies.

Further, since lens support 1112 and lens 1210 are integrated into package 1100, there is essentially no possibility of inadvertently moving lens 1210 relative to image sensor 106. Thus, the prior art possibility of bumping the lens assembly or otherwise having the lens assembly move and defocus the radiation is eliminated.

In another embodiment, an image sensor package 1500 (FIGS. 15, 16) includes a molding 124D having a locking feature 1508. Package 1500 further includes a snap lid 1502 having a tab 1612, where tab 1612 is attached to locking feature 1508 of molding 124D.

To form package 1500, after molding 124D is fabricated, a window 122C is placed in a pocket 1800 (FIG. 18A) of molding 124D. A shelf 1804 of molding 124D contacts and supports a peripheral region 122IPR of an interior surface 122I of window 122C. Snap lid 1502 is secured in place. Once secured, snap lid 1502 presses against a peripheral region 122EPR of an exterior surface 122E of window 122C.

Of importance, window 122C is sandwiched between molding 124D and snap lid 1502. In this manner, window 122C is held in place. Advantageously, use of snap lid 1502 allows window 122C to be kept in a protective wrapper until window 122C is needed. For example, window 122C is kept in a protective wrapper to avoid contamination or scratching of window 122C.

As a further advantage, use of snap lid 1502 allows window 122C to be easily removed. Once removed, window 122C is easily cleaned, treated or replaced with a different window.

More particularly, FIG. 1 is an exploded perspective view of an image sensor package 100 in accordance with the present invention. FIG. 2 is a cross-sectional view of package 100 taken along the line II-II of FIG. 1. Referring to FIGS. 1 and 2 together, package 100 includes a substrate 102 such as an alumina-based ceramic substrate, a printed circuit board substrate, a plastic glass laminated substrate, or a tape-based substrate. Attached to an upper, e.g., first, surface 102U of substrate 102 is an image sensor 106. Illustratively, image sensor 106 is a CMOS image sensor device, a charge coupled device (CCD), or a pyroelectric ceramic on CMOS device although other image sensors are used in other embodiments.

In this embodiment, a lower, e.g. first, surface 106L of image sensor 106 is attached by an adhesive layer 108 to upper surface 102U of substrate 102 although other attachment techniques and/or materials, such as solder, are used in other embodiments. A metallization 109 on upper surface 102U defines a die attach area of substrate 102 to which image sensor 106 is attached.

Image sensor 106 includes an active area 110 on an upper, e.g., second, surface 106U of image sensor 106. Generally, active area 110 is responsive to radiation, e.g., electromagnetic radiation, as is well known to those of skill in the art. For example, active area 110 is responsive to infrared radiation, ultraviolet light, and/or visible light.

Image sensor 106 further includes a plurality of bond pads 112 on upper surface 106U of image sensor 106. Bond pads 112 are connected to internal circuitry of image sensor 106.

Substrate 102 includes a plurality of electrically conductive traces 104 formed on upper surface 102U of substrate 102. Bond pads 112 are electrically connected to corresponding traces 104 by bond wires 114.

As shown in FIG. 2, traces 104 are electrically connected to corresponding electrically conductive vias 215 which extend from upper surface 102U to a lower, e.g., second, surface 102L of substrate 102. Vias 215 are electrically connected to corresponding electrically conductive traces 216 on lower surface 102L of substrate 102. Formed on traces 216 are corresponding electrically conductive pads 217. Formed on pads 217 are corresponding electrically conductive interconnection balls 218 such as solder balls. Interconnection balls 218 are used to electrically connect package 100 to a larger substrate (not shown) such as a printed circuit mother board.

To illustrate, a first bond pad 112A of the plurality of bond pads 112 is electrically connected to a first trace 104A of the plurality of traces 104 by a first bond wire 114A of a plurality of bond wires 114. Trace 104A is electrically connected to a first via 215A of the plurality of vias 215. Via 215A is electrically connected to a first trace 216A of the plurality of traces 216. A first conductive pad 217A of the plurality of conductive pads 217 is formed on trace 216A. Formed on pad 217A is a first interconnection ball 218A of the plurality of interconnection balls 218.

As set forth above, an electrically conductive pathway between bond pad 112A and interconnection ball 218A is formed by bond wire 114A, trace 104A, via 215A, trace 216A and pad 217A. The other bond pads 112, bond wires 114, traces 104, vias 215, traces 216, pads 217 and interconnection balls 218 are electrically connected to one another in a similar fashion so are not discussed further to avoid detracting from the principals of the invention.

Although a particular electrically conductive pathway between interconnection ball 218A and bond pad 112A is described above, in light of this disclosure, it is understood that other electrically conductive pathways can be formed. For example, substrate 102 is a multi-layered laminated substrate and, instead of straight-through vias 215, a plurality of electrically conductive traces on various layers in substrate 102 are interconnected by a plurality of electrically conductive vias to form the electrical interconnections between traces 104 and 216.

As a further example, vias 215 extend along sides 102S of substrate 102 and traces 104 and 106 extend to sides 102S. As another alternative, interconnection balls 218 are distributed in an array format to form a ball grid array type package. Alternatively, interconnection balls 218 are not formed, e.g., to form a metal land array type package or a leadless chip carrier (LCC) package. Other electrically conductive pathway modifications will be obvious to those of skill in the art.

Further, although a particular number of bond pads 112, traces 104 and bond wires 114 are illustrated in FIG. 1, i.e., twenty of each, it is understood that more or less bond pads 112, traces 104, bond wires 114, vias 215, traces 216, pads 217 and interconnection balls 218 are typically used depending upon the particular input/output requirements of image sensor 106.

Package 100 further includes an optical lid 120, which includes a window 122 and a molding 124. Generally, window 122 is transparent to the radiation of interest, e.g. to the radiation to which active area 110 of image sensor 106 is responsive. In this embodiment, window 122 is optical glass, germanium or silicon but can be formed of other materials depending upon the application.

In one embodiment, window 122 includes one or more filters such as an infrared filter, although in other embodiments window 122 does not include a filter. Window 122 is typically planar and has no optical power, although in one embodiment, window 122 has optical power, e.g., is a lens. Window 122 is located above active area 110 of image sensor 106. It is understood that the term "above" and similar terms are used generally and are not necessarily related to a gravitational reference, e.g., package 100 can be inverted without affecting the operation of package 100.

Window 122 is supported by molding 124. Molding 124 is formed of a molding material having excellent adhesion to window 122. To mechanically lock window 122 in place, molding 124 extends inwards beyond sides 122S of window 122. More particularly, an exterior locking feature 225E of molding 124 extends over and contacts a periphery of an exterior surface 122E of window 122 and an interior locking feature 225I of molding 124 extends over and contacts a periphery of an interior surface 122I of window 122. As used herein, the periphery of exterior surface 122E, interior surface 122I is the portion of exterior surface 122E, interior surface 122I, respectively, directly adjacent sides 122S of window 122. Sides 122S extend between exterior surface 122E and interior surface 122I.

Thus, molding 124 mechanically locks window 122 in place both top and bottom. Although molding 124 extends over the peripheries of exterior and interior surfaces 122E, 122I, in alternative embodiments, molding 124 extends over and contacts a periphery of only exterior surface 122E or, alternatively, only interior surface 122I. As a further alternative, molding 124 contacts sides 122S only and does not extend over either interior surface 122I or exterior surface 122E.

Optical lid 120, and more particularly, a base 226 of molding 124 is attached to a periphery of upper surface 102U of substrate 102 by adhesive layer 126. Thus, image sensor 106 is located and enviro-hermetically sealed in an enclosure formed by substrate 102, optical lid 120 and adhesive layer 126. As used herein, the term "enviro-hermetically sealed" means sealed sufficiently to prevent environmental degradation, e.g., from dust or moisture, of package 100 and, more particularly, of image sensor 106. By enviro-hermetically sealing image sensor 106, image sensor 106 is protected from the ambient environment, e.g., dust and moisture.

To further enhance moisture protection of image sensor 106, molding 124 is formed of a material which is highly resistant to moisture. In addition, by having molding 124 extend over the peripheries of exterior and interior surfaces 122E, 122I of window 122, the distance which moisture must travel along the interface between molding 124 and window 122 to reach image sensor 106 is maximized thus further preventing moisture ingress into package 100.

Of importance, molding 124 is a low cost molded part formed of molding compound. Advantageously, molding 124 is significantly less expensive than housings of the prior art which were typically ceramic. Accordingly, package 100 is significantly less expensive to manufacture than image sensor assemblies of the prior art.

By forming molding 124 as a molded part, a distance ZH, sometimes called Z height ZH, between interior surface 122I of window 122 and upper surface 106U of image sensor 106 is precisely controlled. In one embodiment, distance ZH is 0.040 inches (1.016 mm) and the tolerance associated with distance ZH is 0.001 inches (0.025 mm).

Recall that in the prior art, the window was placed on a shelf of a housing after the housing was fabricated. Since a significant tolerance was associated with the window placement, the distance between the window and the image sensor had significant variations from assembly to assembly. However, to insure optimum operation of the image sensor, it is important that the distance between the window and the image sensor be precise. Since the tolerance in this distance is reduced in package 100 compared to the prior art, the performance of package 100 is superior to that of the prior art.

As best shown in FIG. 1, molding 124 includes a plurality of alignment notches 130 which are used to align an optical axis of a lens (not shown) to the optical center of active area 110 of image sensor 106. This alignment is generally referred to as aligning a lens to image sensor 106. Although three alignment notches 130 are illustrated, more or less than three alignment notches 130 are used in alternative embodiments.

Use of alignment notches 130 facilitates alignment of the optical axis of the lens to the optical center of active area 110. As discussed further below, molding 124 is aligned to image sensor 106 and, more particularly, to the optical center of active area 110, to within tight positional tolerances. Advantageously, this allows the optical axis of the lens to be aligned to within tight positional tolerances, e.g., 0.001 inches (0.025 mm), to the optical center of active area 110 in a single operation by aligning the optical axis of the lens to alignment notches 130. Accordingly, alignment of the optical axis of the lens to the optical center of active area 110 is relatively simple compare to the prior art, which required a first alignment of the image sensor to the larger substrate and a second alignment of the optics to the larger substrate.

Enviro-hermetically sealing image sensor 106 also reduces complexity and cost in the event image sensor 106 must be repaired or replaced. Recall that in the prior art, the housing which hermetically sealed the image sensor was mounted directly to the larger substrate. Thus, removal of the housing necessarily exposed the image sensor to the ambient environment and to dust. As a result, the image sensor had to repaired or replaced in a cleanroom or else there was a risk of damaging or destroying the image sensor.

In contrast, image sensor 106 is enviro-hermetically sealed as part of package 100. Package 100 is mounted to the larger substrate, for example, by reflowing interconnection balls 218 as is well known to those of skill in the art. To repair or replace image sensor 106, package 100 is simply removed and a new package 100 is mounted to the larger substrate. At no time is image sensor 106 exposed to the ambient environment during this procedure. Advantageously, this procedure can be performed in any facility with or without a cleanroom. The old package 100 is discarded or shipped to a central facility for repair. Since package 100 is simple to manufacture and service, the costs associated with package 100 are minimized compared to the prior art.

In one embodiment, package 100 is fabricated simultaneously with a plurality of packages 100 to minimize the cost associated with each individual package 100. In accordance with this embodiment, FIG. 3 is an upper perspective view of a plurality of windows 122 in a plurality of cavities 302 of a lower, e.g., first, mold half 300 of a mold and FIG. 4 is a cross-sectional view along the line IV-IV of FIG. 3.

Figure 3:
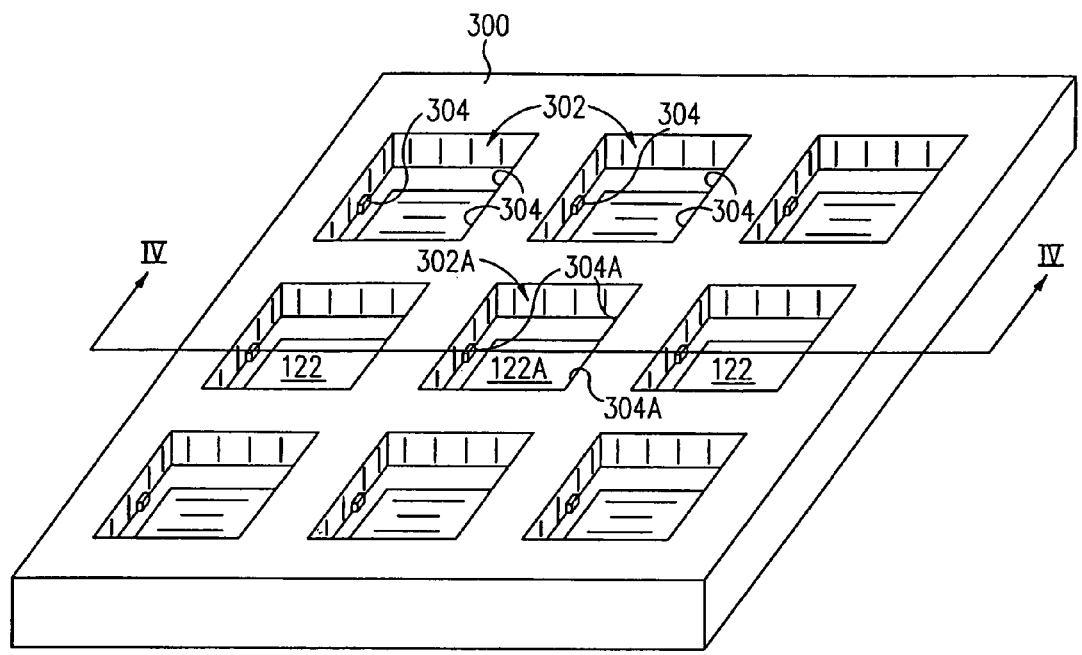
FIG. 3 is an upper perspective view of windows in cavities of a lower mold half of a mold in accordance with the present invention.
Figure 4:
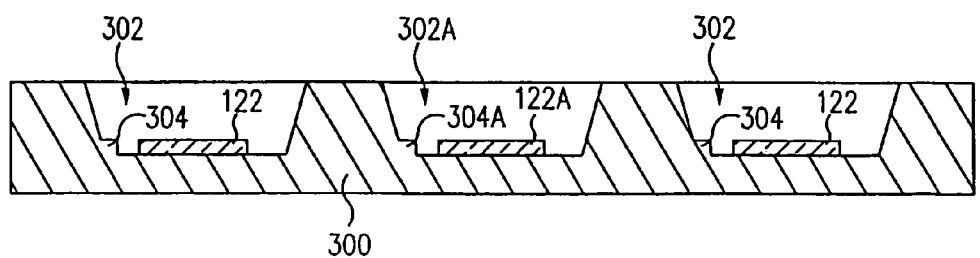
FIG. 4 is a cross-sectional view along the line IV-IV of FIG. 3.

Referring to FIGS. 3 and 4 together, lower mold half 300 defines a three by three (3×3) array of cavities 302 for a total of nine cavities 302, all of which are similar. Although a mold having a three by three array of cavities 302 is set forth, in light of this disclosure, it is understood that a mold having more or less than a three by three array of cavities 302 is used to form more or less, respectively, than nine packages simultaneously.

Positioned in a first cavity 302A of the plurality of cavities 302 is a first window 122A of a plurality of windows 122. Each of the other windows 122 is similarly placed in a corresponding cavity 302 so that each of the nine cavities 302 contains one of windows 122. The placement of an article into a mold cavity is well known to those of skill in the art.

A plurality of tabs 304A protrude from lower mold half 300 into first cavity 302A. In this embodiment, three tabs 304A exist, but only one tab 304A is visible in the views of FIGS. 3 and 4. A set of tabs 304 protrude into each of the other cavities 302 in a similar manner. Tabs 304 which include tabs 304A result in the formation of alignment notches 130 (see FIGS. 1, 2) as discussed further below.

FIG. 5 is a cross-sectional view of the mold of FIGS. 3, 4 at a later stage of fabrication. After windows 122 are positioned in cavities 302 in lower mold half 300, an upper, e.g., second, mold half 500 (FIG. 5) is brought down on lower mold half 300 and into the closed position.

As shown in FIG. 5, upper mold half 500 includes a plurality of extensions 502, all of which are similar, including a first extension 502A. Extension 502A is substantially the inverse shape of cavity 302A and extends downwards from the main body 501 of upper mold half 500. Thus, when upper mold half 500 is in a closed position adjacent lower mold half 300 as illustrated in FIG. 5, extension 502A extends into cavity 302A and presses against window 122A. More particularly, a base 504A of extension 502A presses against interior surface 122I of window 122A and a base 306A which defines cavity 302A of lower mold half 300 presses against exterior surface 122E of window 122A. The other extensions 502 similarly press against the other windows 122.

Figure 6:
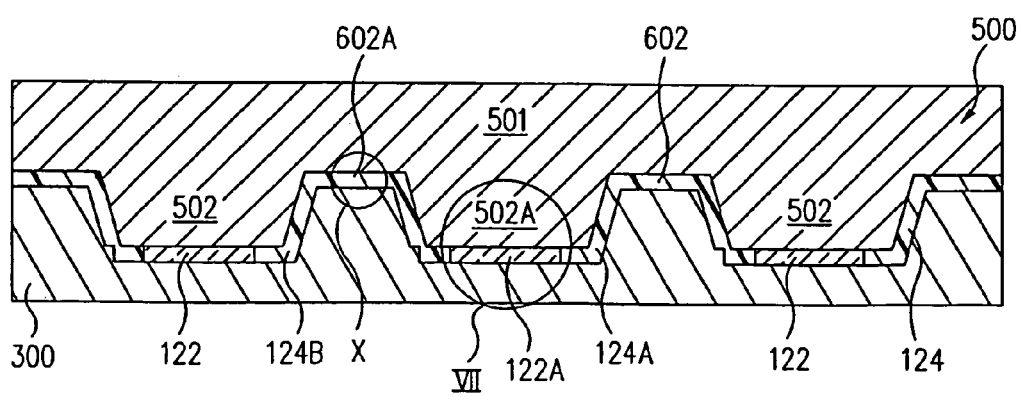
FIG. 6 is a cross-sectional view of the mold of FIG. 5 at a later stage of fabrication.

Further, when upper mold half 500 is in the closed position as illustrated in FIG. 5, upper mold half 500 and lower mold half 300 define a space 506 between upper mold half 500 and lower mold half 300 which is filled with molding compound as shown in FIG. 6.

FIG. 6 is a cross-sectional view of the mold of FIG. 5 at a later stage of fabrication. As shown in FIG. 6, molding compound is transferred into space 506 (FIG. 5) to form moldings 124. The transfer of molding compound into a mold is well known to those of skill in the art. As an example, a molding compound is heated to a melt and then forced between upper mold half 500 and lower mold half 300. After being transferred to the mold, i.e., upper mold half 500 and lower mold half 300, the molding compound is allowed to cool and solidify.

Generally, the molding compound should be mechanically stable over all temperatures to which package 100 may be heated. For example, the molding compound should be mechanically stable at the temperature which package 100 is heated during attachment to the larger substrate such as the printed circuit mother board. As an illustration, the molding compound is mechanically stable when heated to 220° C. for one minute. Suitable molding compounds are available from Amoco Performance Products, Inc. located in Atlanta, Ga., e.g., A-100, A-200, A-300, R-5000, R-5100, R-5700 resins.

A first molding 124A of the plurality of moldings 124 encloses window 122A and surrounds extension 502A. The other moldings 124 similarly enclose corresponding windows 122 and surround corresponding extensions 502. Of importance, by molding windows 122 in moldings 124 using upper and lower mold halves 500, 300, windows 122 are precisely positioned in moldings 124 to within tight tolerance, e.g., to within 0.001 in. (0.025 mm). As discussed above in reference to FIG. 2, this allows the Z height ZH to be precisely controlled which ensures optimum performance of package 100. This is in contrast to the prior art where placement of the window on the shelf of the housing after the housing was fabricated resulted in significant variations in the position of the window from assembly to assembly.

The plurality of moldings 124 are integrally connected together. More particularly, bridge sections 602 of molding compound integrally connect adjacent moldings 124. To illustrate, a first bridge section 602A of the plurality of bridge sections 602 integrally connects first molding 124A to an adjacent second molding 124B of the plurality of moldings 124.

FIG. 7A is an enlarged cross-sectional view of the region VII of FIG. 6 in accordance with one embodiment of the present invention. As shown in FIG. 7A, base 504A presses directly on interior surface 122I of window 122A and base 306A presses directly on exterior surface 122E of window 122A. In this manner, molding compound is prevented from contacting either interior surface 122I or exterior surface 122E of window 122A. Accordingly, molding 124A contacts only sides 122S of window 122A and does not extend over interior surface 122I or exterior surface 122E of window 122A.

FIG. 7B is an enlarged cross-sectional view of the region VII of FIG. 6 in accordance with another embodiment of the present invention. This embodiment is substantially similar with the embodiment illustrated in FIG. 7A with the exception that molding 124A includes exterior locking feature 225E and interior locking feature 225I.

As shown in FIG. 7B, exterior locking feature 225E extends over and contacts a periphery of exterior surface 122E of window 122A. Similarly, interior locking feature 225I extends over and contacts a periphery of interior surface 122I of window 122A. Exterior and interior locking features 225E, 225I are flash, i.e., molding compound which is forced between base 306A and exterior surface 122E and between base 504A and interior surface 122I, respectively, during the transfer of the molding compound to the mold. However, control of flash may be difficult depending upon the particular application.

FIG. 7C is an enlarged cross-sectional view of the region VII of FIG. 6 in accordance with yet another embodiment of the present invention. In accordance with this embodiment, base 504A includes a pad 710 and base 306A includes a pad 712. Pads 710, 712 are typically a compliant material such a silicone. In one embodiment, pads 710, 712 are each 0.25 millimeters (mm) thick.

As shown in FIG. 7C, pad 710 contacts a central region 122ICR of interior surface 122I of window 122. Central region 122ICR is surrounded by peripheral region 122IPR of interior surface 122I of window 122A. In one embodiment, interior surface 122I is 8.5 mm square and peripheral region 122IPR extends inward 1.0 mm from sides 122S of window 122A, i.e., central region 122ICR is located 1.0 mm from sides 122S of window 122.

Similarly, pad 712 contacts a central region 122ECR of exterior surface 122E of window 122A. Central region 122ECR is surrounded by peripheral region 122EPR of exterior surface 122E of window 122A. In one embodiment, exterior surface 122E is 8.5 mm square and peripheral region 122EPR extends inward 1.0 mm from sides 122S of window 122A, i.e., central region 122ECR is located 1.0 mm from sides 122S of window 122.

Use of pads 710, 712 creates spaces between peripheral regions 122IPR, 122EPR and bases 504A, 306A, respectively. Advantageously, molding compound fills these spaces during the transfer of the molding compound into the mold. As a result, interior locking feature 225I is formed between peripheral region 122IPR and base 504A and exterior locking feature 225E is formed between peripheral region 122EPR and base 306A. Further, since molding 124A, including interior and exterior locking features 225I, 225E, is formed during a single molding step, molding 124A including interior and exterior locking features 225I, 225E is integral, i.e., molding 124A, interior locking feature 225I and exterior locking feature 225E are all the same piece and are not a plurality of separate pieces connected together.

In FIGS. 7B, 7C, both interior and exterior locking features 225I, 225E are illustrated. However, in an alternative embodiment, only interior locking feature 225I or exterior locking feature 225E is formed. As an example, referring to FIG. 7C, only pad 710 or pad 712 is used resulting in the formation of only interior locking feature 225I or exterior locking feature 225E, respectively.

Although in FIGS. 7A, 7B and 7C, molding of first window 122A of the plurality of windows 122 in first molding 124A of the plurality of moldings 124 is discussed, in light of this disclosure, it is understood that the other windows 122 are molded in corresponding moldings 124 simultaneously and in a similar manner.

Figure 8:
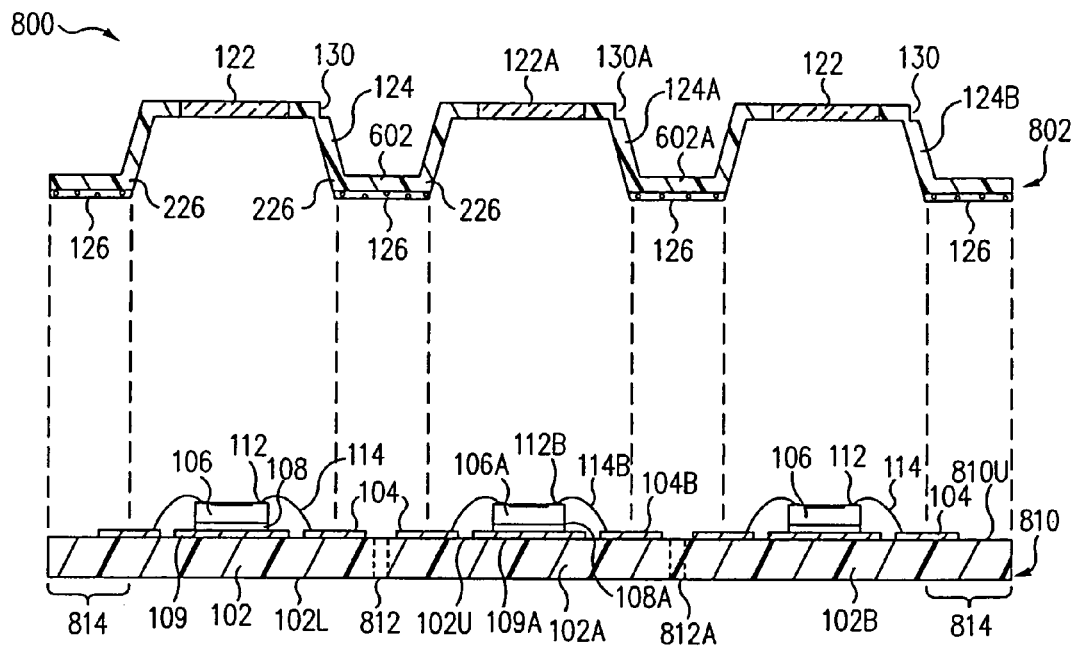
FIG. 8 is a cross-sectional view of an array of image sensor packages during assembly in accordance with the present invention.

FIG. 8 is a cross-sectional view of an array 800 of image sensor packages 100 during assembly in accordance with the present invention. After molding windows 122 in molding compound, a molded window array 802 is removed from the mold, i.e., is removed from lower mold half 300 and upper mold half 500 (see FIG. 6). Molded window array 802 includes windows 122, which, in this embodiment, are supported by and molded in corresponding moldings 124. For example, first window 122A of the plurality of windows 122 is supported by and molded in first molding 124A of the plurality of moldings 124. Each of the other windows 122 is similarly supported by and molded in a corresponding molding 124.

Each of moldings 124 include a plurality of alignment notches 130. For example, molding 124A includes three alignment notches 130A of the plurality of alignment notches 130 although only one alignment notch 130A is shown in the view of FIG. 8. Alignment notches 130 are formed by, and correspond to, tabs 304 of lower mold half 300 (see FIGS. 3 and 4).

As shown in FIG. 8, array 800 includes a substrate 810. Substrate 810 includes a plurality of individual substrates 102 integrally connected together in an array format. Each of substrates 102 is delineated and separated by a singulation street 812 which is located between adjacent substrates 102. For example, a first singulation street 812A of a plurality of singulation streets 812 separates a first substrate 102A of the plurality of substrates 102 from a second substrate 102B of the plurality of substrates 102. The other substrates 102 are similarly separated from adjacent substrates 102 by corresponding singulation streets 812.

Substrates 102 include traces 104 and metallizations 109 on upper surfaces 102U of substrates 102. Substrates 102 also includes vias 215 extending through substrates 102 and traces 216, pads 217 on lower surfaces 102L of substrate 102 which are not illustrated in FIG. 8 for purposes of clarity. See vias 215, traces 216 and pads 217 of FIG. 2 for example. In one embodiment, metalized vias along singulation streets 812 are combined with conductive lands to provide LCC footprints.

Image sensors 106 are attached to corresponding substrates 102, and more particularly, to corresponding metallizations 109, by corresponding adhesive layers 108. For example, a first image sensor 106A of the plurality of image sensors 106 is attached to substrate 102A, and more particularly, to metallization 109A, by adhesive layer 108A. The other image sensors 106 are similarly attached.

During attachment, image sensors 106 are aligned to substrate 810 using any one of a number of conventional alignment techniques, e.g., are optically or mechanically aligned.

In one embodiment, a pick and place machine such as a MRSI 505 by MRSI Corp. of Chelmsford, Mass. is used to align image sensors 106 to substrate 810. Of importance, this allows image sensors 106 to be precisely aligned to substrate 810 to within tight positional tolerances, e.g., to within 0.001 inches (0.025 mm).

Bond pads 112 of image sensors 106 are electrically connected to corresponding traces 104 by corresponding bond wires 114. For example, a bond pad 112B of the plurality of bond pads 112 is electrically connected to a corresponding trace 104B of the plurality of traces 104 by a bond wire 114B of the plurality of bond wires 114. The other bond pads 112 are similarly connected.

An adhesive layer 126 is applied to bases 226 of each of moldings 124 and to bridge sections 602. Adhesive layer 126 is applied using any one of a number of conventional techniques, e.g., a B stage epoxy is applied by screen printing or needle dispensing or, alternatively, a double sided laminate adhesive tape is applied by pressure.

Instead of applying adhesive layer 126 directly to bases 226 of moldings 124 and to bridge sections 602 as illustrated in FIG. 8, in an alternative embodiment, adhesive layer 126 is applied to selective portions of an upper surface 810U of substrate 810, and more particularly, is applied over and extends slightly beyond singulation streets 812 and is applied over a periphery 814 of substrate 810.

After application of adhesive layer 126, molded window array 802 is aligned with substrate 810 using any one of a number of conventional alignment techniques, e.g., is optically or mechanically aligned. Of importance, molded window array 802 is precisely aligned with substrate 810, and hence image sensors 106, to within tight positional tolerance, e.g., to within 0.001 inches (0.025 mm).

After alignment, molded window array 802 is moved and brought into abutting contact with substrate 810 such that adhesive layer 126 contacts both molded window array 802 and substrate 810. If necessary, e.g., if adhesive layer 126 is a B staged epoxy, adhesive layer 126 is cured. In this manner, molded window array 802 is attached to substrate 810 by adhesive layer 126.

FIG. 9 is a cross-sectional view of array 800 of image sensor packages 100 of FIG. 8 at a later stage of fabrication in accordance with the present invention. After molded window array 802 is attached to substrate 810, in one embodiment, each molding 124 or substrate 102 is marked, for example with ink, to identify the part number associated with image sensor package 100. In accordance with this embodiment, a lower surface 810L of substrate 810 is populated with interconnection balls 218, e.g., on traces (not shown).

Array 800 is then singulated into a plurality of individual image sensor packages 100 (see FIGS. 1, 2) by separating array 800 along singulation streets 812. Singulation can be accomplished using any one of a number of conventional singulation techniques, e.g. by laser cutting or mechanical sawing through substrate 810, adhesive layer 126 and bridge sections 602. In one embodiment, periphery 814 and the overlying adhesive layer 126 and overlying section of molded window array 802 are also trimmed during singulation.

In accordance with an alternative embodiment of the present invention, substrate 810 is a snap straight substrate, i.e., is a substrate designed to snap along singulation streets 812 on bending of substrate 810. Snap straight substrates, typically ceramic, are well known to those of skill in the art and are not discussed further to avoid detracting from the principles of the invention.

In accordance with this embodiment, bridge sections 602 of molded window array 802 and adhesive layer 126 are also designed to snap along with substrate 810 along singulation streets 812. Bridge sections 602 are formed of a molding compound which is sufficiently brittle to snap. In other embodiments, bridge sections 602 are fabricated to have less strength than the remainder of molded window array 802 to facilitate snapping of bridge sections 602 as discussed in greater detail below with respect to FIGS. 10A, 10B.

Figure 10A:
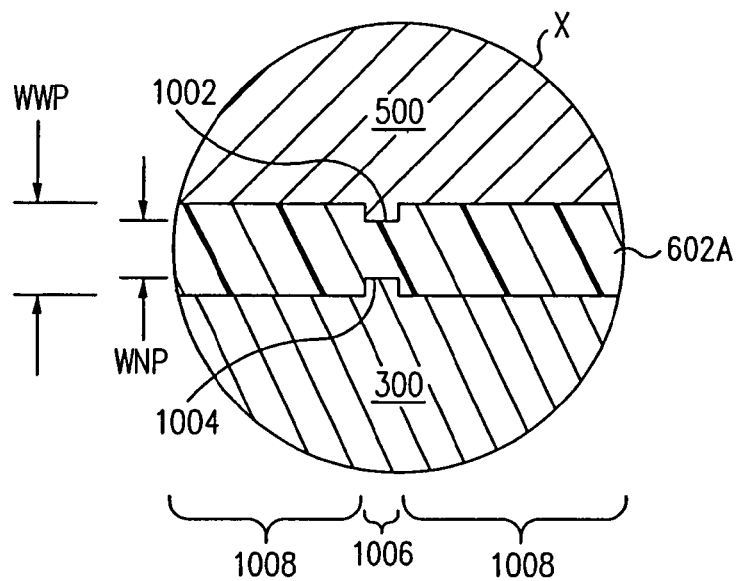
FIG. 10A is an enlarged cross-sectional view of the region X of FIG. 6 in accordance with one embodiment of the present invention.

FIG. 10A is an enlarged cross-sectional view of the region X of FIG. 6 in accordance with this embodiment of the present invention. As shown in FIG. 10A, upper mold half 500 includes a tab 1002 which extends from upper mold half 500 downwards towards lower mold half 300. Similarly, lower mold half 300 includes a tab 1004 which extends from lower mold half 300 upwards towards upper mold half 500.

Tabs 1002 and 1004 are located directly across from one another and define a narrow portion 1006 of bridge section 602A. Narrow portion 1006 has a width WNP less than a width WWP of a second wide portion 1008 of bridge section 602A. Since narrow portion 1006 has less width than wide portion 1008, narrow portion 1006 has less mechanical strength than wide portion 1008. Thus, referring to FIGS. 9 and 10A together, bridge section 602A preferentially snaps apart at narrow portion 1006 when substrate 810 is snapped along a singulation street 812.

Figure 10B:
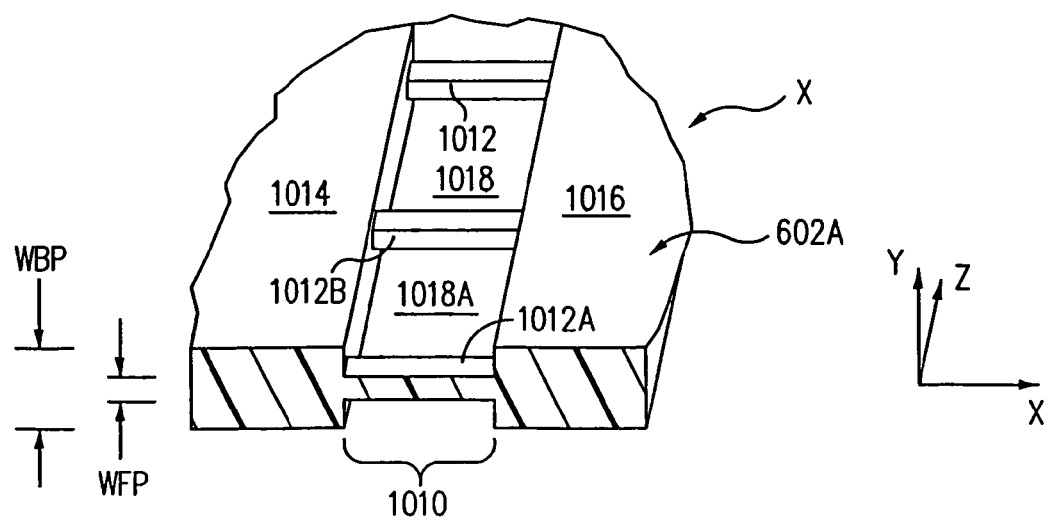
FIG. 10B is an enlarged perspective view, partially in cross-section, of the region X of FIG. 6 in accordance with an alternative embodiment of the present invention.

FIG. 10B is an enlarged perspective view, partially in cross-section, of the region X of FIG. 6 in accordance with an alternative embodiment of the present invention. In FIG. 10B, upper and lower mold halves 500, 300 are not illustrated for purposes of clarity.

In this embodiment, bridge section 602A includes a finger portion 1010, which is sometimes called webbing. Finger portion 1010 includes a plurality of fingers 1012 extending between body portions 1014 and 1016 of bridge section 602A. A space 1018 exists between each of fingers 1012 along the depth of bridge section 602A (i.e. along the Z axis of FIG. 10B) and between body portions 1014, 1016 in the horizontal direction (i.e., along the X axis of FIG. 10B). To illustrate, a first space 1018A of the plurality of spaces 1018 exists between first and second fingers 1012A, 1012B of the plurality of fingers 1012 and between body portions 1014, 1016.

In one embodiment, each of fingers 1012 has a width WFP (along the Y axis of FIG. 10B) less than a width WBP of body portions 1014, 1016. By forming finger portion 1010 with fingers 1012 and spaces 1018, finger portion 1010 has less mechanical strength than body portions 1014, 1016. Thus, referring to FIGS. 9 and 10B together, bridge section 602A preferentially snaps apart at finger portion 1010 when substrate 810 is snapped along a singulation street 812.

Although only a single bridge section 602A of the plurality of bridge sections 602 is described and illustrated in each of the embodiments of FIGS. 10A, 10B, the other bridge sections 602 are similar in structure and function so are not described further.

By forming a plurality of packages 100 simultaneously, several advantages are realized. One advantage is that it is less labor intensive to handle and process a plurality of packages 100 simultaneously rather than to handle and process each package 100 on an individual basis. Another advantage is that usage of materials is more efficient when an array of packages 100 is fabricated. By reducing labor and using less material, the cost associated with each package 100 is minimized. However, in light of this disclosure, those of skill in the art will recognize that packages 100 can also be manufactured on an individual basis if desired.

Figure 11:
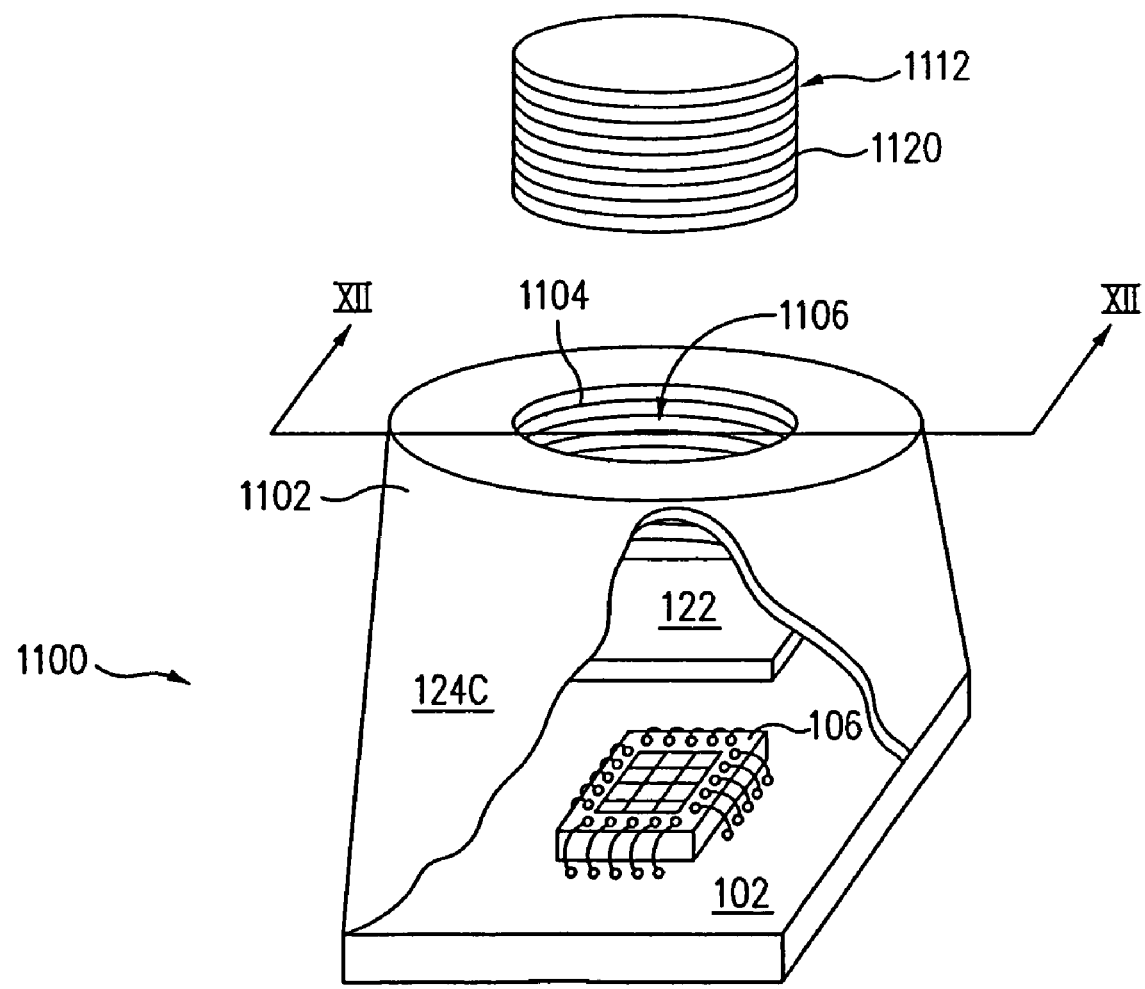
FIG. 11 is a perspective view, partially cutaway and partially exploded, of an image sensor package in accordance with another embodiment of the present invention.
Figure 12:
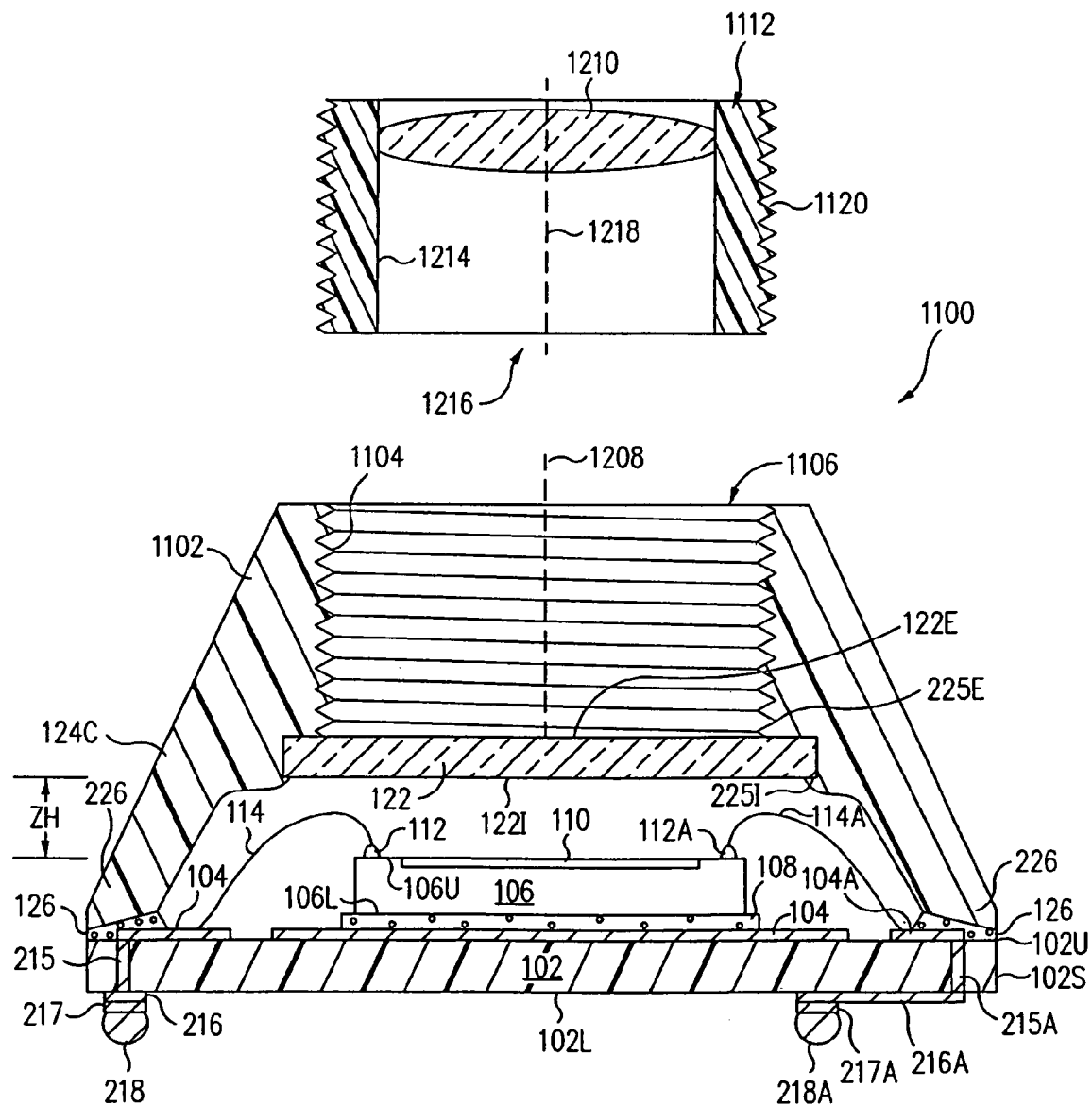
FIG. 12 is a cross-sectional view of the package taken along the line XII-XII of FIG. 11.

FIG. 11 is a perspective view, partially cutaway and partially exploded, of an image sensor package 1100 in accordance with another embodiment of the present invention. FIG. 12 is a cross-sectional view of package 1100 taken along the line XII-XII of FIG. 11. Referring to FIGS. 11 and 12 together, package 1100 is similar in many respects with package 100 of FIGS. 1 and 2 and the discussion above in reference to package 100 is incorporated herein. To avoid detracting from the principals of the invention, only the relevant differences between packages 1100 and 100 are discussed below.

Molding 124C of package 1100 includes a lens holder extension portion 1102. Molding 124C including lens holder extension portion 1102 is integral, i.e., is one piece and not a plurality of separate pieces connected together. Lens holder extension portion 1102 extends upwards, e.g. in a first direction perpendicular to exterior surface 122E of window 122, from window 122. Lens holder extension portion 1102 includes an interior cylindrical surface 1104 which defines an aperture 1106. A longitudinal axis 1208 of aperture 1106 is perpendicular to a plane parallel to window 122 and, more particularly, is perpendicular to exterior and interior surfaces 122E, 122I of window 122 in this embodiment. Aperture 1106 extends upward from window 122 such that window 122 is exposed through aperture 1106.

To facilitate attachment of an optical element 1210 such as a lens (hereinafter lens 1210), interior cylindrical surfaced 1104 is threaded. Stated another way, aperture 1106 is a female threaded aperture.

Lens 1210 is supported in a support 1112, hereinafter lens support 1112. Lens support 1112 is a cylindrical annulus having an interior cylindrical surface 1214 which defines an aperture 1216. Lens 1210 is positioned in aperture 1216 such that lens 1210 and lens support 1112 have a common longitudinal axis 1218.

Lens support 1112, sometimes called a lens barrel, has an exterior cylindrical surface 1120, which is threaded. Stated another way, lens support 1112 is male threaded. Of importance, the threading of exterior cylindrical surface 1120 corresponds with the threading of interior cylindrical surface 1104 allowing threaded attachment of lens support 1112 to molding 124C.

To attach lens support 1112 to molding 124C, lens support 1112 is positioned above molding 124C such that longitudinal axes 1208, 1218 are substantially aligned as best shown in FIG. 12. Lens support 1112 is threaded into aperture 1106 so that exterior cylindrical surface 1120 is threadedly attached to interior cylindrical surface 1104 of molding 124C.

Advantageously, lens 1210 is readily adjusted relative to image sensor 106 by rotating lens support 1112. More particularly, lens support 1112 is rotated around longitudinal axis 1218 in a first direction, e.g., clockwise looking down at lens support 1112, to move lens support 1112 and lens 1210 towards image sensor 106. Conversely, lens support 1112 is rotated around longitudinal axis 1218 in a second direction opposite the first direction, e.g., counterclockwise looking down at lens support 1112, to move lens support 1112 and lens 1210 away from image sensor 106. In this manner, lens support 1112 is rotated until radiation passing through lens 1210 is properly focused on active area 110 of image sensor 106. Once proper focus is attained, lens support 1112 is prevented from unintentional rotation. For example, adhesive is applied to secure lens support 1112 to molding 124C.

Recall that in the prior art, the lens assembly was typically attached directly to the larger substrate, such as a printed circuit mother board, after the image sensor assembly was attached to the larger substrate. A large tolerance was associated with attachment of the lens assembly in this manner.

However, it is important to reduce tolerances to optimize performance of the image sensor assembly.

Further, the lens assembly of the prior art typically had to be adjusted by moving the lens assembly relative to the larger substrate, for example with adjustment screws. Undesirably, this was labor intensive which increased the cost of the electronic device which used the image sensor assembly.

In addition, the lens assembly of the prior art was sometimes inadvertently moved relative to the image sensor which caused defocusing and defective operation of the image sensor. For example, the lens assembly was sometimes bumped during assembly or servicing of the electronic device which used the image sensor assembly. As another example, the lens assembly moved due to warpage of the substrate.

Advantageously, package 1100 in accordance with the present invention eliminates these problems of the prior art. In particular, since molding 124C is precisely positioned to within tight tolerance of image sensor 106, the position both horizontally and vertically in the view of FIG. 12 of lens 1210 with respect to image sensor 106 is also precise to within tight tolerance, e.g., to within 0.001 in. (0.025 mm). More particularly, the optical axis of lens 1210 is precisely aligned with the optical center of active area 110 of image sensor 106. Reducing tolerance in the position of lens 1210 with respect to image sensor 106 improves performance of package 1100 compared to prior art image sensor assemblies.

Further, lens 1210 is adjusted relative to image sensor 106 simply by rotating lens support 1112 thus readily allowing focusing of radiation on active area 110 of image sensor 106. Advantageously, this focusing is performed during fabrication of package 1100 before assembly to the larger substrate. Thus, the prior art requirement of focusing the lens assembly during assembly of the larger substrate is eliminated. As a result, the costs associated with package 1100 are lower than those associated with prior art image sensor assemblies.

Further, since lens support 1112 and lens 1210 are integrated into package 1100, there is essentially no possibility of inadvertently moving lens 1210 relative to image sensor 106. Thus, the prior art possibility of bumping the lens assembly or otherwise having the lens assembly move and defocus the radiation is eliminated.

Fabrication of package 1100 is similar in many respects with fabrication of package 100 of FIGS. 1 and 2 and the discussion above regarding the fabrication of package 100 is incorporated herein. To avoid detracting from the principals of the invention, only the relevant differences between the fabrication of package 1100 and the fabrication of package 100 are discussed below.

Figure 13:
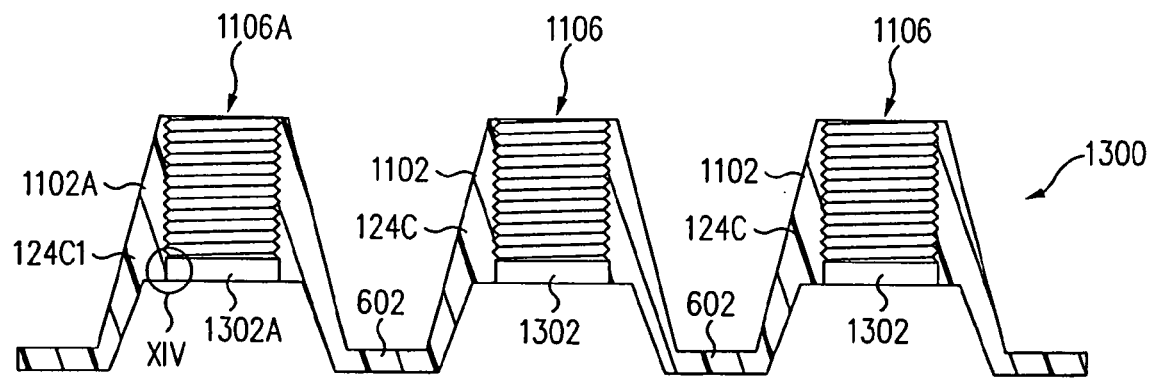
FIG. 13 is a cross-sectional view of a molded window array in accordance with one embodiment of the present invention.

FIG. 13 is a cross-sectional view of a molded window array 1300 in accordance with one embodiment of the present invention. Molded window array 1300 is formed using a multi-piece mold, e.g., a three or four piece mold. In one particular embodiment, apertures 1106 are formed by molding around threaded plugs, which are then unscrewed from molded window array 1300.

Molded window array 1300 of FIG. 13 is substantially similar to molded window array 802 of FIG. 8 except that each molding 124C of molded window array 1300 includes a lens holder extension portion 1102 and a pocket 1302 for supporting a window 122. For example, a first molding 124C1 of the plurality of moldings 124C includes a first lens holder extension portion 1102A of the plurality of lens holder extension portions 1102 and a first pocket 1302A of the plurality of pockets 1302. The other moldings 124C have similar corresponding lens holder extension portions 1102 and pockets 1302 so are not discussed further.

Figure 14:
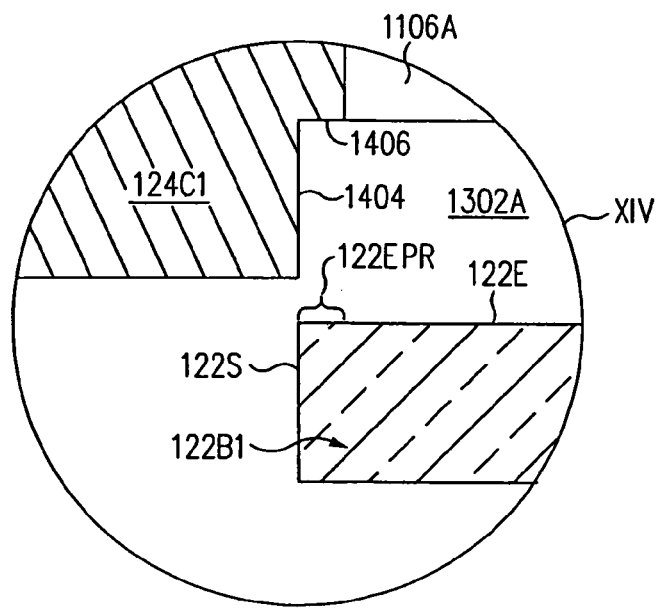
FIG. 14 is an enlarged cross-sectional view of the region XIV of FIG. 13.

FIG. 14 is an enlarged cross-sectional view of the region XIV of FIG. 13 in accordance with this embodiment of the present invention. Referring to FIG. 14, pocket 1302A is shaped to fit and support a window 122B1 (window 122B1 is not illustrated in FIG. 13 for purposes of clarity). More particularly, pocket 1302A is essentially the same size and shape as window 122B1. Pocket 1302A is defined by sides 1404 of molding 124C1 which correspond to sides 122S of window 122B1. Pocket 1302A is further defined by a shelf 1406 of molding 124C1, which is perpendicular to sides 1404 and extends inwards from sides 1404. Shelf 1406 corresponds to a peripheral region 122EPR of an exterior surface 122E of window 122B1.

In accordance with this embodiment, after molded window array 1300, and in particular molding 124C1, is fabricated, window 122B1 is secured in pocket 1302A. As an illustration, window 122B1 is placed into pocket 1302A and an adhesive is applied to secure window 122B1 in place. Advantageously, this allows window 122B1 to be kept in a protective wrapper until just before the assembly of molded window array 1300 to the substrate, for example, to substrate 810 of FIG. 8. By waiting to secure window 122B1 to molding 124C1 just before the assembly of molded window array 1300 to the substrate, possible contamination of window 122B1, for example during shipment of molded window array 1300, is avoided.

Although securing of a first window 122B1 of a plurality of windows 122 to first pocket 1302A of the plurality of pockets 1302 is discussed above, in light of this disclosure, it is understood that the other windows 122 are secured in corresponding pockets 1302 in a similar manner.

Referring again to FIG. 13, in an alternative embodiment, instead of forming pockets 1302, windows 122 are molded into molded window array 1300 during the fabrication of molded window array 1300. Molding of windows 122 in accordance with this embodiment is substantially similar to molding of windows 122 as discussed in reference to the embodiments of FIGS. 7A, 7B and 7C, the discussion of which is incorporated herein.

Figure 15:
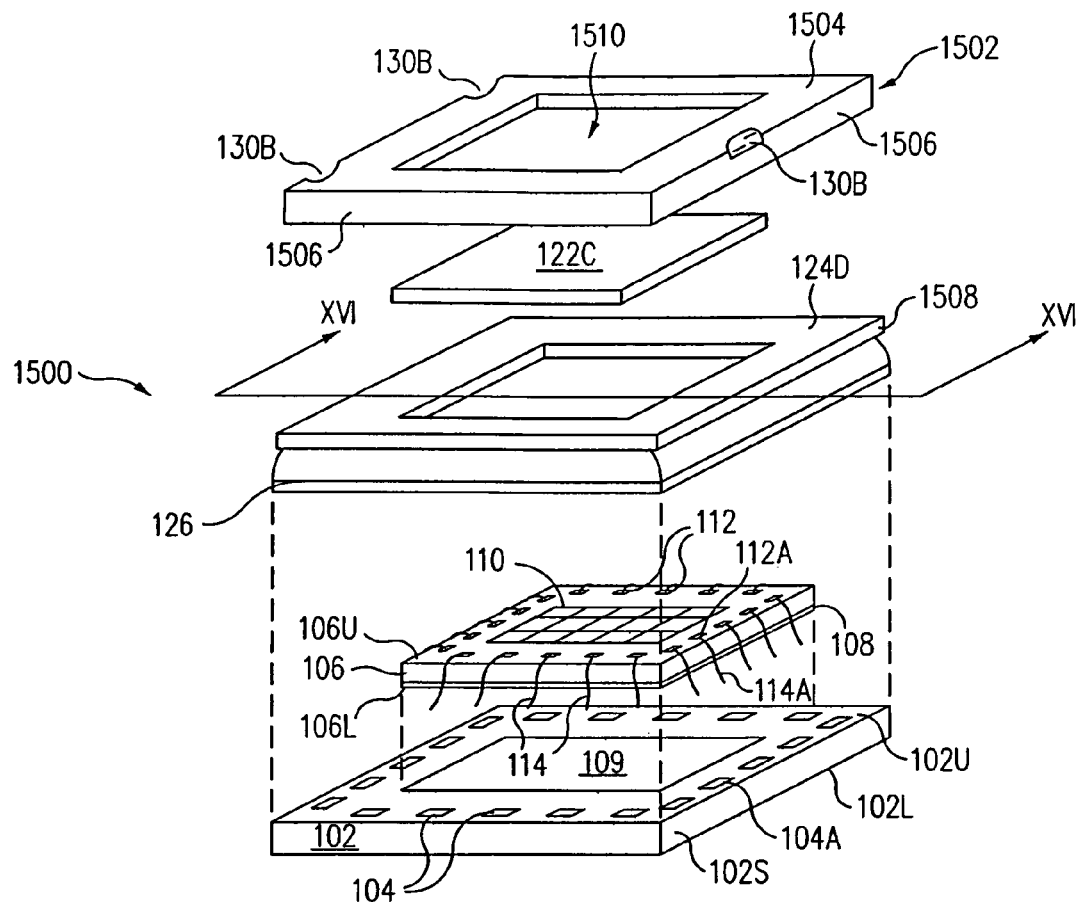
FIG. 15 is an exploded perspective view of an image sensor package in accordance with another embodiment of the present invention.
Figure 16:
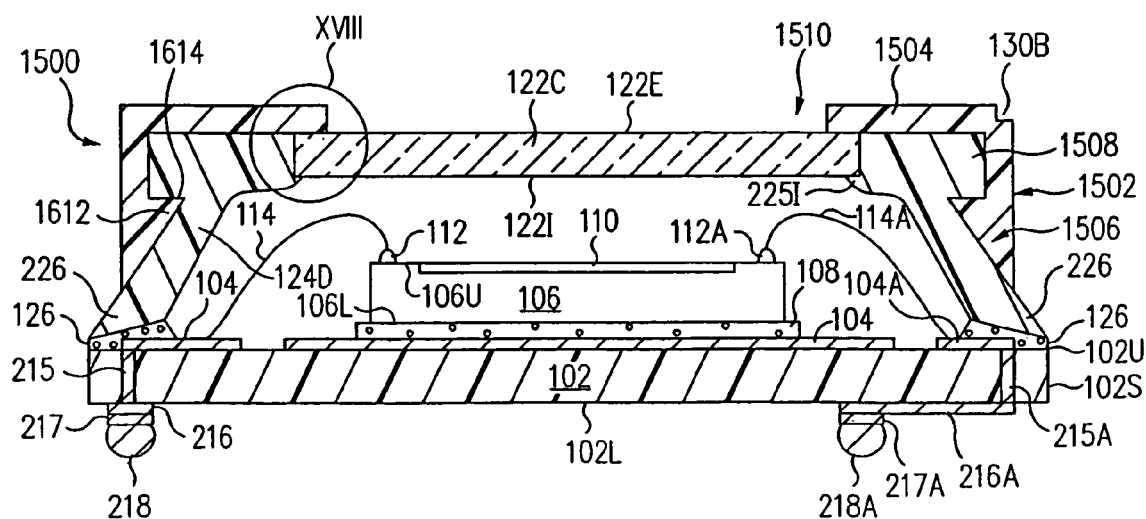
FIG. 16 is a cross-sectional view of the package taken along the line XVI-XVI of FIG. 15.

FIG. 15 is an exploded perspective view of an image sensor package 1500, sometimes called a camera module, in accordance with another embodiment of the present invention. FIG. 16 is a cross-sectional view of package 1500 taken along the line XVI-XVI of FIG. 15. Referring to FIGS. 15 and 16 together, package 1500 is similar in many respects with package 100 of FIGS. 1 and 2 and the discussion above in reference to package 100 is incorporated herein. To avoid detracting from the principals of the invention, only the relevant differences between packages 1500 and 100 are discussed below.

Package 1500 includes a snap lid 1502 which snaps onto a molding 124D of package 1500 to hold a window 122C in place. In one embodiment, snap lid 1502 is a low cost molded part. Snap lid 1502 includes a plurality of alignment notches 130 used to align the lens (not shown) to image sensor 106.

Snap lid 1502 includes a compression ring section 1504 which presses against window 122C to hold window 122C in place as discussed further below. Snap lid 1502 further includes a snap 1506 extending downwards from compression ring section 1504. Snap 1506 snaps onto a corresponding locking feature 1508 of molding 124D to attach snap lid 1502 to molding 124D.

In this embodiment, compression ring section 1504 is rectangular and includes a rectangular central aperture 1510. A central region of window 122C (see central region 122CR of FIGS. 18A and 18B for example) is exposed to the ambient environment through aperture 1510. During use, radiation passes through aperture 1510, though window 122C and strikes active area 110 of image sensor 106.

Snap 1506 extends downwards from edges of compression ring section 1504 towards molding 124D, perpendicular to a plane defined by compression ring section 1504. As shown in FIG. 16, snap 1506 includes an inwardly extending tab 1612, e.g., a hook-like feature, which is attached to locking feature 1508 of molding 124D.

In this embodiment, locking feature 1508 of molding 124D is shaped as a rectangular bar extending outward in a plane parallel to compression ring section 1504 from molding 124D along all four sides of molding 124D. Locking feature 1508 includes a lip 1614. Tab 1612 is in abutting contact with lip 1614 such that snap 1506 encompasses and holds locking feature 1508 thus securing snap lid 1502 to molding 124D.

Figure 17:
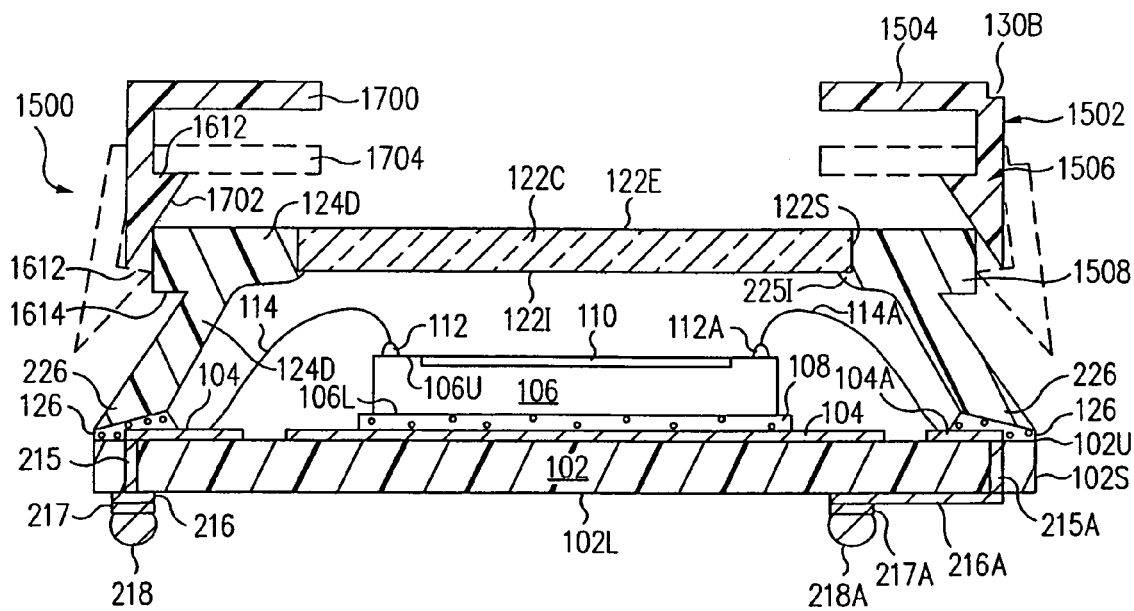
FIG. 17 is a cross-sectional view of the package of FIGS. 15 and 16 illustrating the attachment of a snap lid to a molding.

FIG. 17 is a cross-sectional view of package 1500 illustrating the attachment of snap lid 1502 to molding 124D in accordance with this embodiment of the present invention. After window 122C is placed in molding 124D, snap lid 1502 is aligned with molding 124D. Once aligned, snap lid 1502 is at a position 1700. At position 1700, snap 1506 is laterally aligned to extend around locking feature 1508. Further, at position 1700, snap lid 1502 is in its relaxed state, i.e., is not stressed.

After alignment, snap lid 1502 is snapped onto molding 124D. To facilitate this snapping, snap lid 1502 is pressed towards molding 124D. This causes snap 1506 to slide against locking feature 1508. To facilitate this sliding, snap 1506 includes a taper 1702 which slides against locking feature 1508.

As taper 1702 slides against locking feature 1508, snap 1506 is distorted and bent away from compression ring section 1504. This produces stress in snap lid 1502 which causes tab 1612 to press inward against locking feature 1508. To illustrate, at a position 1704 (indicated in dashed lines for clarity), snap 1506 is distorted and bent and tab 1612 is pressing inward against locking feature 1508.

Snap lid 1502 is pressed towards molding 124D until tab 1612 reaches lip 1614 of locking feature 1508. Upon tab 1612 reaching lip 1614, stress in snap lid 1502 causes snap 1506 to snap inwards such that tab 1612 engages lip 1614 as shown in FIG. 16. Advantageously, stress created in snap lid 1502 during attachment firmly presses snap 1506 around locking feature 1508 so that snap lid 1502 is securely attached to molding 124D. When attached, snap lid 1502 holds window 122 in place as discussed in reference to FIGS. 18A and 18B.

Figure 18A:
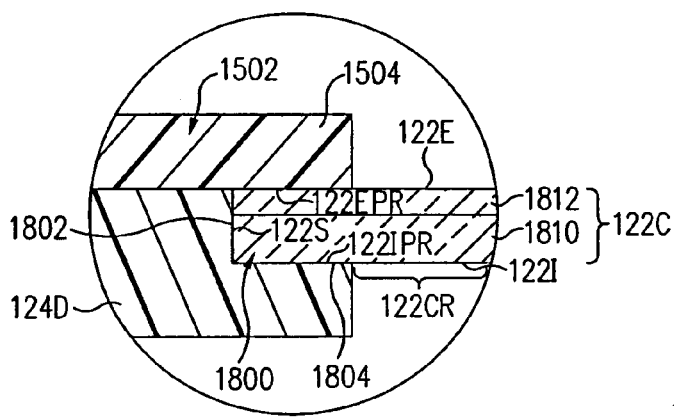
FIG. 18A is an enlarged cross-sectional view of the region XVIII of the package of FIG. 16 in accordance with one embodiment of the present invention.

FIG. 18A is an enlarged cross-sectional view of the region XVIII of FIG. 16 in accordance with this embodiment of the present invention. As shown in FIG. 18A, window 122C is supported in a pocket 1800 defined by sides 1802 and a shelf 1804 of molding 124D. Sides 1802 of molding 124D are substantially the same width (in the vertical direction of the view of FIG. 18A) as sides 122S of window 122C. Shelf 1804 is perpendicular to sides 1802 and extends inward from sides 1802.

In accordance with this embodiment, after molding 124D is fabricated, window 122C is placed in pocket 1800. After placement of window 122C in pocket 1800, shelf 1804 contacts and supports a peripheral region 122IPR of interior surface 122I of window 122C. Snap lid 1502 is secured in place as described in reference to FIG. 17. Once secured, snap lid 1502, and more particularly compression ring section 1504, contacts and presses against a peripheral region 122EPR of exterior surface 122E of window 122C.

Of importance, window 122C is sandwiched between molding 124D and snap lid 1502. In this manner, window 122C is held in place. Advantageously, use of snap lid 1502 allows window 122C to be kept in a protective wrapper until window 122C is needed. For example, window 122C is kept in a protective wrapper to avoid contamination or scratching of window 122C.

As a further advantage, use of snap lid 1502 allows window 122C to be easily removed. In light of this disclosure, those of skill in the art will understand that snap 1506 (FIG. 16) is pulled away from molding 124D to unlock tab 1612 from lip 1614 and thus allow removal of snap lid 1502 from molding 124D. Once removed, window 122C is easily cleaned, treated or replaced with a different window. As an example of a suitable window 122C, window 122C in FIG. 18A includes a first layer 1810 such as planar glass and a second layer 1812 such as an infrared filter. However, in other embodiments, window 122C is a single layer such a single piece of planar glass.

Further, in some applications, it may be desirable to prevent window 122C from being removable. To prevent window 122C from being removable, in one embodiment, window 122C is permanently secured to molding 124D. For example, adhesive is applied to adhere window 122C in pocket 1800 before snap lid 1502 is secured.

In reference to FIG. 17, the attachment of a single snap lid 1502 to a single molding 124D is described. However, in an alternative embodiment, molding 124D is fabricated simultaneously with a plurality of moldings 124D as part of a molded window array similar to molded window array 802 of FIG. 8. Windows 122C and snap lids 1502 are attached to moldings 124D while moldings 124D are still part of the molded window array. This attachment occurs while the molded window array is separate from a substrate, e.g., substrate 810 of FIG. 8. Alternatively, this attachment occurs after the molded window array is attached to a substrate, e.g., substrate 810 of FIG. 9. As a further alternative, molding 124D is singulated from the other moldings 124D of the molded window array, window 122 and snap lid 1502 attached, and molding 124D attached to the individual substrate, e.g. substrate 102 of FIG. 15.

Figure 18B:
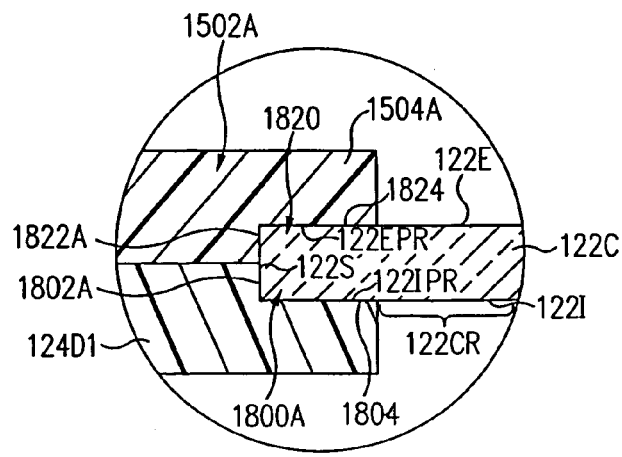
FIG. 18B is an enlarged cross-sectional view of the region XVIII of the package of FIG. 16 in accordance with an alternative embodiment of the present invention.

FIG. 18B is an enlarged cross-sectional view of the region XVIII of package 1500 of FIG. 16 in accordance with an alternative embodiment of the present invention. The embodiment of FIG. 18B is substantially similar to the embodiment of FIG. 18A with the exception that sides 1802A of molding 124D1 are shorter than sides 122S of window 122C and compression ring section 1504A of snap lid 1502A includes a pocket 1820.

Pocket 1820 of snap lid 1502A is symmetric with pocket 1800A of molding 124D1. Pocket 1820 is defined by sides 1822A and a shelf 1824 of snap lid 1502A. Shelf 1824 is perpendicular to sides 1822A and extends inward from sides 1822A. Sides 1802A and 1822A lie on a common plane and the combined width (in the vertical direction in the view of FIG. 18B) of sides 1802A and 1822A is substantially equal to the width of sides 122S of window 122C. Shelfs 1824, 1804 press on peripheral regions 122EPR, 122IPR of exterior and interior surfaces 122E, 122I, respectively, of window 122. In this manner, window 122C is supported in pockets 1800A and 1820 and held in place.

This application is related to: Webster, U.S. patent application Ser. No. 09/457,505, filed Dec. 8, 1999, now U.S. Pat. No. 6,455,774, issued Sep. 24, 2002, entitled "MOLDED IMAGE SENSOR PACKAGE"; Webster, U.S. patent application Ser. No. 09/457,513, filed Dec. 8, 1999, now U.S. Pat. No. 6,483,101, issued Nov. 19, 2002, entitled "MOLDED IMAGE SENSOR PACKAGE HAVING LENS HOLDER"; Glenn et al., U.S. patent application Ser. No. 09/457,515, filed Dec. 8, 1999, now U.S. Pat. No. 6,526,653, issued Mar. 4, 2003, entitled "METHOD OF ASSEMBLING A SNAP LID IMAGE SENSOR PACKAGE"; Glenn et al., U.S. patent application Ser. No. 09/458,033, filed Dec. 8, 1999, now U.S. Pat. No. 6,266,197, issued Jul. 24, 2001, entitled "MOLDED WINDOW ARRAY FOR IMAGE SENSOR PACKAGES"; and Glenn et al., U.S. patent application Ser. No. 09/457,517, filed Dec. 8, 1999, now U.S. Pat. No. 6,389,687, issued May 21, 2002, entitled "METHOD OF FABRICATING IMAGE SENSOR PACKAGES IN AN ARRAY"; which are all herein incorporated by reference in their entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A camera module, comprising:
a substrate;
an image sensor comprising an active area for receiving light, the image sensor being coupled to a first surface of the substrate;
a molding coupled to the first surface of the substrate, the molding comprising a locking feature, the locking feature consisting of a rectangular bar extending from the molding; and
a hook-like feature attached to the locking feature.

2. The camera module of claim 1 wherein the camera module is mounted on a larger substrate.

3. The camera module of claim 1 wherein the camera module is electrically connected to a larger substrate.

4. The camera module of claim 1 further comprising a means for electrically connecting the camera module to a larger substrate.

5. The camera module of claim 4 wherein the means for electrically connecting is coupled to a second surface of the substrate.

6. The camera module of claim 1 further comprising an adhesive layer coupling the molding to the substrate.

7. The camera module of claim 6 wherein the molding is attached to a periphery of the first surface of the substrate by the adhesive layer.

8. The camera module of claim 1 wherein bond pads of the image sensor are coupled to traces of the substrate.

9. The cameral module of claim 1 further comprising bond wires coupling bond pads of the image sensor to traces of the substrate.

10. A camera module, comprising:
a substrate;
an image sensor comprising an active area for receiving light, the image sensor being coupled to a first surface of the substrate;
a molding comprising a means for locking, the means for locking consisting of a rectangular bar extending from the molding;
a mechanical attachment means attached to the means for locking; and
a window between the mechanical attachment means and the molding.

11. The camera module of claim 10 further comprising an adhesive layer attaching the molding to the substrate, wherein the window, the molding, the adhesive layer, and the substrate form an enclosure around the image sensor.

12. The camera module of claim 10 wherein the mechanical attachment means comprises a plurality of alignment notches.

13. The camera module of claim 10 wherein the mechanical attachment means comprises:
a compression ring section comprising a central aperture.

14. The camera module of claim 13 wherein a central region of the window is exposed through the central aperture.

15. The camera module of claim 10 wherein the molding comprises a first pocket comprising a shelf, the shelf supporting a peripheral region of an interior surface of the window.

16. The camera module of claim 15 wherein the first pocket further comprises sides having a width substantially the same as a width of sides of the window.

17. The camera module of claim 10 wherein the means for locking comprises a lip, the mechanical attachment means comprising an inwardly extending tab in abutting contact with the lip.

18. The camera module of claim 17 wherein the mechanical attachment means further comprises a taper.

19. A camera module, comprising:
a substrate;
an image sensor comprising an active area for receiving light, the image sensor being coupled to a first surface of the substrate;
a molding coupled to the substrate, the molding comprising a first pocket and a locking feature, the locking feature consisting of a rectangular bar extending from the molding;
a window in the first pocket; and
a means for securing the window in the first pocket, the means for securing being coupled to the rectangular bar of the molding.

20. The camera module of claim 19 further comprising a means for electrically connecting the camera module to a larger substrate.

* * * * *